United States Patent
Brox et al.

(10) Patent No.: US 11,409,354 B2
(45) Date of Patent: Aug. 9, 2022

(54) MULTI-VOLTAGE OPERATION FOR DRIVING A MULTI-MODE CHANNEL

(71) Applicant: Micron Technology, Inc., Boise, ID (US)

(72) Inventors: Martin Brox, Munich (DE); Thomas Hein, Munich (DE)

(73) Assignee: Micron Technology, Inc., Boise, ID (US)

(*) Notice: Subject to any disclaimer, the term of this patent is extended or adjusted under 35 U.S.C. 154(b) by 164 days.

(21) Appl. No.: 16/849,746

(22) Filed: Apr. 15, 2020

(65) Prior Publication Data
US 2020/0333871 A1    Oct. 22, 2020

Related U.S. Application Data

(60) Provisional application No. 62/836,870, filed on Apr. 22, 2019.

(51) Int. Cl.
*G06F 1/3234* (2019.01)
*G11C 11/4074* (2006.01)

(52) U.S. Cl.
CPC ........ *G06F 1/3268* (2013.01); *G11C 11/4074* (2013.01)

(58) Field of Classification Search
CPC .............. G06F 1/3268; G11C 11/4074; G11C 11/4091; G11C 5/14; G11C 7/1084; G11C 7/1057
See application file for complete search history.

(56) References Cited

U.S. PATENT DOCUMENTS

| 2007/0139071 A1 | 6/2007 | Nguyen |
| 2012/0074983 A1 | 3/2012 | Nguyen |
| 2013/0002301 A1 | 1/2013 | Gondi et al. |
| 2017/0090546 A1 | 3/2017 | Brunolli et al. |
| 2017/0288717 A1* | 10/2017 | Lee .................. H04L 25/03878 |
| 2019/0027205 A1 | 1/2019 | Hollis et al. |

OTHER PUBLICATIONS

ISA/KR, International Search Report and Written Opinion of the International Searching Authority, Int'l Appl. No. PCT/US2020/028466, dated Jul. 30, 2020, Korean Intellectual Property Office, Seo-gu, Daejeon, Republic of Korea, 13 pgs.

* cited by examiner

*Primary Examiner* — Tri M Hoang
(74) *Attorney, Agent, or Firm* — Holland & Hart LLP

(57) ABSTRACT

Methods, systems, and devices for multi-voltage operation for driving a multi-mode channel are described. A transmitting device and a receiving device may be coupled via a channel, and the channel may support multiple modes such as a terminated mode and an unterminated mode. A driver may be coupled with the channel, and a voltage supply for the driver may be adjusted based on the mode of the channel, such as based on whether the channel is terminated or unterminated. Adjusting the voltage supply may result in similar or otherwise desirable voltage levels on the channel for each mode of the channel.

24 Claims, 11 Drawing Sheets

MULTI-VOLTAGE OPERATION FOR DRIVING A MULTI-MODE CHANNEL

CROSS REFERENCE

The present Applications for Patent claims the benefit of U.S. Provisional Patent Application No. 62/836,870 by BROX et al., entitled "MULTI-VOLTAGE OPERATION FOR DRIVING A MULTI-MODE CHANNEL," filed Apr. 22, 2019, assigned to the assignee hereof, and expressly incorporated by reference herein.

BACKGROUND

The following relates generally to a system that includes at least one memory device and more specifically to multi-voltage operation for driving a multi-mode channel.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some systems, a device may be coupled with one or more other devices via one or more channels, where the device and the other devices may communicate via the channels. A set of one or more channels may be referred to as an interface. For example, in a memory system, a memory device may be coupled with a host device (e.g., a processor) via one or more interfaces, each of which may include at least one channel.

DETAILED DESCRIPTION

Figure 1:
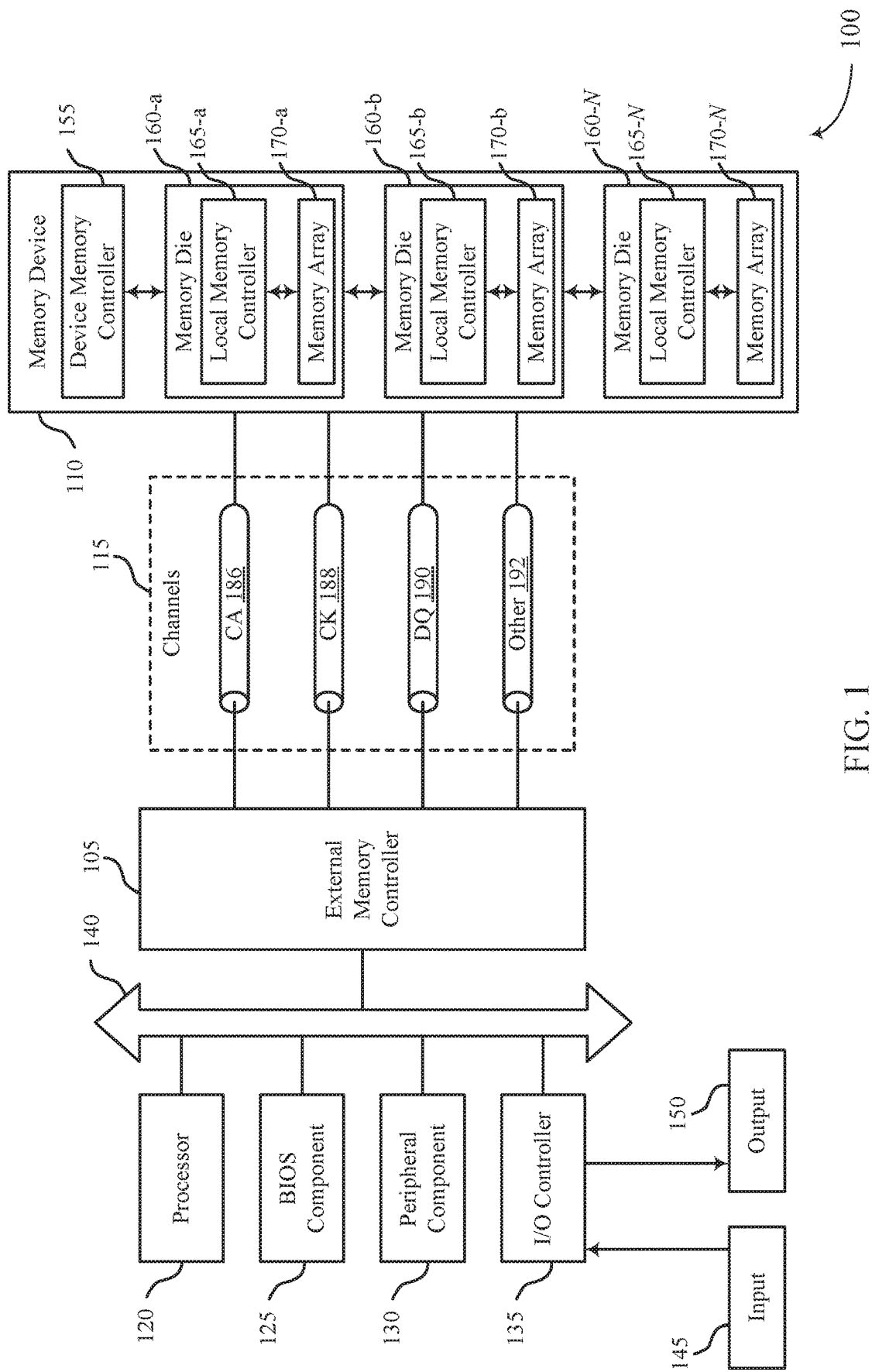
FIG. 1 illustrates an example of a system that supports multi-voltage operation for driving a multi-mode channel in accordance with examples as disclosed herein.

A channel between devices in a computing system may in some cases comprise one or more terminations, where the terminations may be configured to promote the integrity of signals exchanged via the channel (e.g., by reducing noise, reducing cross-talk, or by other mechanisms). For example, a channel may be low-level terminated, in which case the channel may be coupled via a configured impedance component (termination) to a voltage reference that is lower than at least one other voltage reference in the system, such as a ground reference or a negative voltage reference, which may be referred to as VSS. As another example, a channel may be high-level terminated, in which case the channel may be coupled via a configured impedance component (termination) to a voltage reference that is higher than at least one other voltage reference in the system, such as a positive voltage reference, which may be referred to as VDD. A channel that is low-level terminated or high-level terminated may be generically referred to as a terminated channel or as in a terminated mode, and the impedance of the configured impedance component may be referred to as a termination impedance or channel impedance.

While terminating a channel may promote signal integrity, it may also increase power consumption by reducing the impedance between the channel and the voltage reference to which the termination impedance is coupled. Conversely, removing the termination impedance may, at least theoretically (e.g., ignoring parasitic effects), result in an open circuit between the channel and the voltage reference, save for any current paths internal to the devices coupled with the channel. A channel that is operated without a configured termination impedance may be generically referred to as an unterminated channel or as in an unterminated mode.

Thus, a tradeoff may exist between signal integrity benefits that may be associated with a terminated channel and power consumption benefits that may be associated with an unterminated channel. As described herein, a computing system may take advantage of such a tradeoff by including one or more channels (e.g., as part of an interface) that may be switched from being terminated to being unterminated. Whether a channel is in a terminated mode or an unterminated mode may, in some cases, relate to a present mode of the computing system. For example, a first mode of the computing system may correspond to a high power, high speed mode, which may involve processing-intensive functions. Additionally or alternatively, such a first mode may be associated with a high data rate and the use of one or more terminated channels between devices of the system, such as between a memory device and a host device for the memory device (e.g., a central processing unit (CPU) or graphics processing unit (GPU)). As another example, a second mode of the computing system may correspond to a low power mode, similar to an idle mode, where processing requirements or demands may be minimal. Additionally or alternatively, such a second mode may be associated with a low data rate between devices of the system, and a channel that was terminated in the first mode may be unterminated in the second mode.

In some cases, changing a channel from a terminated mode to an unterminated mode may impact the voltage swing (range) of signaling on a channel. For example, in a low-terminated mode, the termination impedance may act as a voltage divider that results in an upper bound of the signaling over the channel being some fraction of the supply voltage for the driver generating the signaling (e.g., if the supply voltage for the driver is VDD, then voltages on the channel may be limited to one half of VDD due to impedance matching between the driver and the termination impedance). In an unterminated mode, however, an upper bound of the signaling over the channel may be equal to the supply voltage for the driver generating the signaling (e.g., VDD), and voltages over the channel may swing from rail to rail (e.g., from VSS to VDD, where VSS is a lower supply voltage for the driver).

A different (e.g., increased) voltage swing for signaling over the channel when the channel is unterminated versus terminated may have one or more related drawbacks. For example, in some systems, the channel may be associated with a maximum operating voltage. The maximum operating voltage for the channel may be based on one or more components of a device receiving the signaling. In some cases, for example, the receiving device may employ one or more transistors with a voltage tolerance (e.g., gate oxide breakdown voltage), and if the voltage on the channel exceeds the voltage tolerance of a transistor, the transistor may be destroyed or otherwise rendered unusable. Transistors with lower voltage tolerances (e.g., thinner gate oxide layers) may in some cases offer faster switching speeds, smaller form factors, or other benefits, but when used in a receiving device, such transistors may limit the maximum operating voltage of the channel. Thus, a different (e.g., increased) voltage swing for signaling over the channel when the channel is unterminated may result in voltages over the channel that exceed the voltage tolerance, which may limit the ability of the receiving device to include transistors or other components with desired performance characteristics. As another example, a different (e.g., increased) voltage swing for signaling over the channel when the channel is unterminated versus terminated may result in increased complexity at the receiving device, as the receiving device may need to monitor for signaling with different voltage levels depending on the mode of the channel.

Systems and techniques described herein, however, may support the use of different voltage levels at the transmitting device based on the mode of the channel. For example, a voltage supply for a driver at the transmitting device may be adjusted based on the channel impedance (e.g., based on whether the channel is terminated or unterminated). In some cases, the voltage supply for the driver may be set to a first (e.g., high) voltage when the channel is terminated to a second (e.g., low) voltage when the channel is unterminated. The first and second voltages may be configured such that voltages over the channel are unchanged or at largely unchanged when the channel switches between terminated and unterminated mode. For example, signaling over the channel may reach an upper bound when the voltage supply is set to the first voltage and the channel is terminated, and the second voltage may be configured to equal that upper bound. Further, in some cases, the driver may be configured to output over the channel signaling with a different data rate (e.g., higher baud rate, higher order of modulation, or both) when the channel is terminated than when the channel is unterminated. In some cases, the transmitting device may be a memory device, and the receiving device may be a host device for the memory device, or vice versa.

Thus, for example, the systems and techniques described herein may support terminating a channel when a higher data rate or other performance benefits are desired and unterminating the channel when lower power consumption or other performance benefits are desired. Additionally or alternatively, the systems and techniques described herein may support the use of components at the receiving device with lower voltage tolerances (e.g., transistors with faster switching speeds or smaller form factors), decrease the complexity of one or more aspects of the receiving device, or provide other benefits.

Features of the disclosure are initially described in the context of a memory system and device as described with reference to FIGS. 1 and 2. Features of the disclosure are described in the context of systems that support multi-voltage operation for driving a multi-mode channel, related signals over a channel, and a related process flows as described with reference to FIGS. 3-6. These and other features of the disclosure are further illustrated by and described with reference to apparatus diagrams and flowcharts that relate to multi-voltage operation for driving a multi-mode channel as described with references to FIGS. 7-10.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as a multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, inputs 145, or outputs 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

In some examples, a channel 115 may be associated with a maximum operating voltage (voltage limit) that may not be exceeded. For example, the external memory controller 105 or another aspect of the system 100 may include one or more transistors with a voltage tolerance, beyond which the operation of the transistors may be undesirably compromised, which may limit the voltages that may be used over a channel 115 coupled with the external memory controller.

In some cases, as described herein, a termination impedance between a channel 115 and a voltage reference (e.g., a ground reference or VSS) may be configurable, including dynamically during operation of the system 100 (e.g., depending on an operating mode of the system 100). For example, a device coupled with the channel 115 (e.g., the external memory controller 105) may couple the channel 115 with a corresponding termination impedance to place the channel in the terminated mode and may decouple the channel 115 from the corresponding termination impedance to place the channel in the unterminated mode.

In the context of a channel 115 carrying signaling between a transmitting device (e.g., the memory device 110) and a receiving device (e.g., the external memory controller 105), either the transmitting device or the receiving device may configure (adjust, switch, change) the termination impedance and indicate the mode (e.g., impedance, terminated versus unterminated) of the channel to the other device. Though examples described herein may describe the receiving device as operating (e.g., configuring the termination impedance of) the channel 115 and transmitting related indications to the transmitting device, it is to be understood that the examples described herein may be adapted to systems in which the transmitting device operates (e.g., configures the termination impedance of) the channel 115 and possibly transmits one or more related indications to the receiving device.

To ensure that voltages over the channel do not exceed the maximum operative voltage for the channel, regardless of the impedance of the channel 115, a voltage supply for a driver associated with another device coupled with the channel 115 (e.g., a driver associated with the memory device 110) may be adjusted (e.g., dynamically) based on whether the channel 115 is terminated or unterminated, or otherwise based on an impedance of the channel 115. When the channel 115 is unterminated, for example, the voltage supply for the driver may be set to a lower voltage that when the channel 115 is terminated.

Channels 115 (and associated signal paths and terminals) may be dedicated to communicating specific types of information. In some cases, a channel 115 may be an aggregated channel and thus may include multiple individual channels, each of which may individually be switchable between being terminated or unterminated. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a driver for the transmitting device may output signaling over the channel using a first modulation scheme when the channel has a first impedance (e.g., is terminated) and using a second modulation scheme when the channel has a second impedance (e.g., is unterminated). The first modulation scheme may be of a higher order (e.g., PAM3 or PAM4) than the second modulation scheme (e.g., PAM 2 or NRZ).

Figure 2:
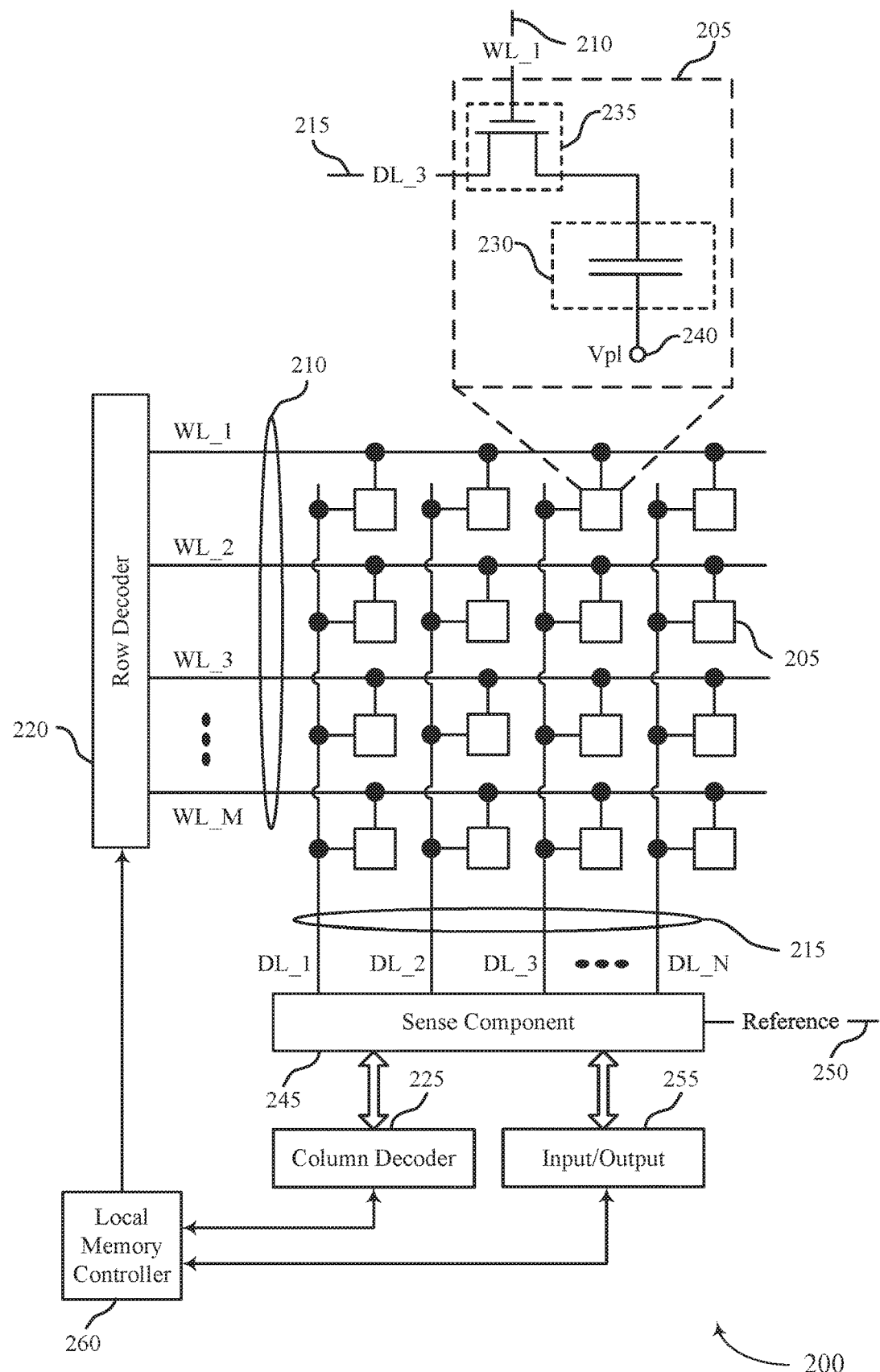
FIG. 2 illustrates an example of a memory die that supports multi-voltage operation for driving a multi-mode channel in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
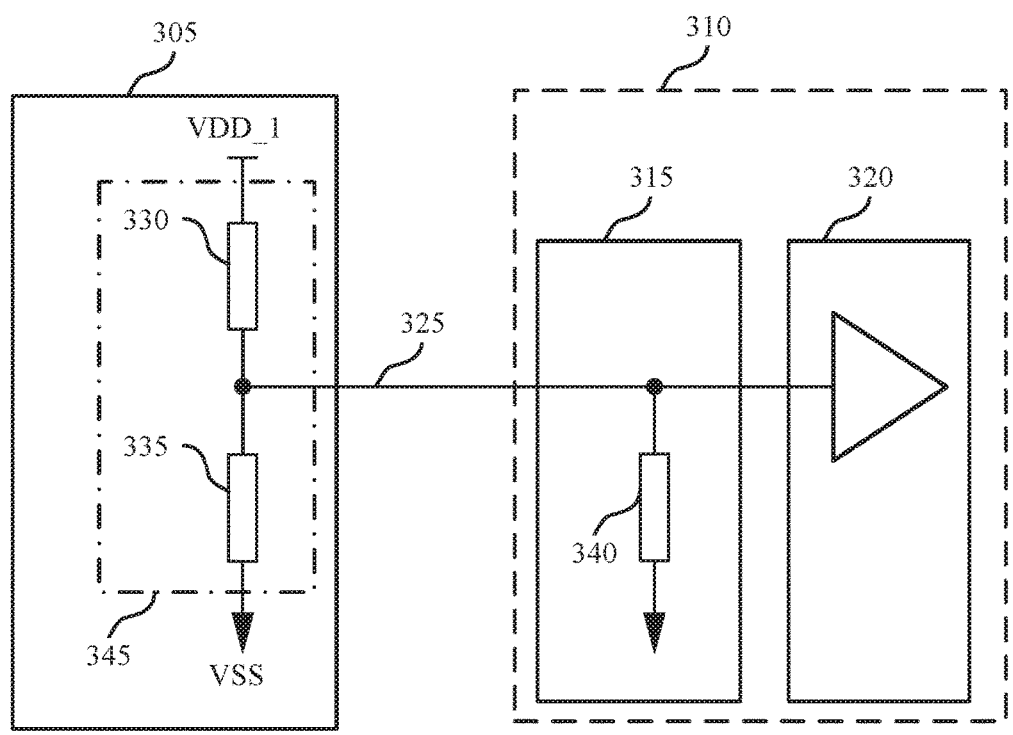
FIG. 3A an example of a system that supports multi-voltage operation for driving a multi-mode channel in accordance with examples as disclosed herein.

FIG. 3A illustrates an example of a system 300 that supports multi-voltage operation for driving a multi-mode channel as disclosed herein. The system 300 may include a transmitting device 305 and a receiving device 310. In some cases, either of the transmitting device 305 or the receiving device 310 may be an example of a memory device 110 or a host device (e.g., an external memory controller 105) as described with reference to FIGS. 1 and 2. The transmitting device 305 and the receiving device 310 may be coupled by a channel 325, which may be an example of a channel 115 as described with reference to FIG. 1.

A driver 345 may be included in (e.g., as an on-chip driver) or otherwise associated with (e.g., controlled by) the transmitting device 305. The transmitting device 305 may operate the driver 345 to generate and output signaling over the channel 325, which may be received by the receiving device 310.

The driver 345 may have (e.g., be coupled with) an upper voltage supply, the voltage of which may be referred to as VDD. The driver may also have (e.g., be coupled with) a lower voltage supply, the voltage of which may be referred to as VSS. VSS may be at a lower voltage than VDD. In some cases, VSS may a ground voltage or a negative voltage. In some cases, one or both of VDD and VSS may be generated internally (e.g., as an internal voltage reference) or received from an external source. For example, in some cases, VDD may correspond to the voltage at a pin of the transmitting device 305, such as an output stage drain power voltage (VDDQ) pin as defined in an industry standard or specification (e.g., a Joint Electron Device Engineering Council (JEDEC) specification).

The driver 345 may include one or more internal impedances. For example, in the example of system 300, the driver 345 may be a push-pull driver and include a pull-up impedance 330 (e.g., between the output of the driver 345 and the upper voltage supply) and a pull-down impedance (e.g., between the output of the driver 345 and the lower voltage supply).

The receiving device 310 may include a termination component 315 and a receiving component 320. The receiving component 320 may be configured to monitor for and process signaling received via the channel 325 (e.g., from the transmitting device 305).

The termination component 315 may include a termination impedance 340, and the impedance of the channel 325 may depend on (be based on) the impedance of termination impedance 340. The impedance of the channel 325 may be variable (e.g., able to dynamically vary during operation of the system 300). For example, the termination component 315 may be configured to selectively couple or decouple the channel 325 from the termination impedance 340 (e.g., via a switching component, such as one or more transistors, that may be coupled with the channel 325 and the termination impedance 340). When the channel 325 is coupled with the termination impedance 340, the channel 325 may be in a terminated mode. When the channel 325 is decoupled from the termination impedance 340, the channel 325 may be in an unterminated mode. Additionally or alternatively, the impedance of the termination impedance 340 may be configurable (e.g., dynamically configurable) by the termination component 315, such as by selectively incorporating or removing impedance-inducing components from the termination impedance 340. The termination impedance 340 may be coupled with a voltage reference, the voltage of which may be lower than VDD and in some cases equal to VSS.

In the example of the system 300, the termination component 315 is included in the receiving device 310. In some examples, however, the termination component 315 may be an element of the transmitting device 305. Alternatively, in some examples, the termination component 315 may be separate from both the transmitting device 305 and the receiving device 310 but may be controlled by one or both of the transmitting device 305 and the receiving device 310.

As described above, the channel 325 may sometimes operate in a terminated mode (e.g., a high-level or low-level terminated mode) and may sometimes operate in an unterminated mode. When the channel 325 is in the terminated mode, the upper voltage supply for the driver 345 may be set to a first value, which may be referred to as VDD_1 (that is, VDD may be equal to VDD_1 when the channel 325 is in the terminated mode).

FIG. 3A illustrates the system 300 with the channel 325 operating (configured) in a low-level terminated mode. When the channel 325 is in the low-level terminated mode, the voltage of the channel 325 may vary from a lower bound to an upper bound, where the lower bound is equal or approximately equal to VSS and the upper bound is based on VDD_1, the first pull-up impedance 330, and the termination impedance 340, as described further with reference to FIG. 3B.

In some examples, it may be desirable to keep the voltage of the channel 325 below some limit. For example, one or more transistors included in the receiving component 320 may have a voltage tolerance, and transistors may be degraded or destroyed if the voltage of the channel 325 exceeds the voltage tolerance. For example, the transistors included in the receiving component 320 may be short-channel and/or thin-oxide transistors, which may provide fast switching speeds or other performance benefits. Whether for this or other reasons, exceeding the voltage limit for the channel 325 may cause reliability issues for system 300 or otherwise be undesirable (e.g., may cause a transistor at the receiving device 310 to fail).

Figure 3B:
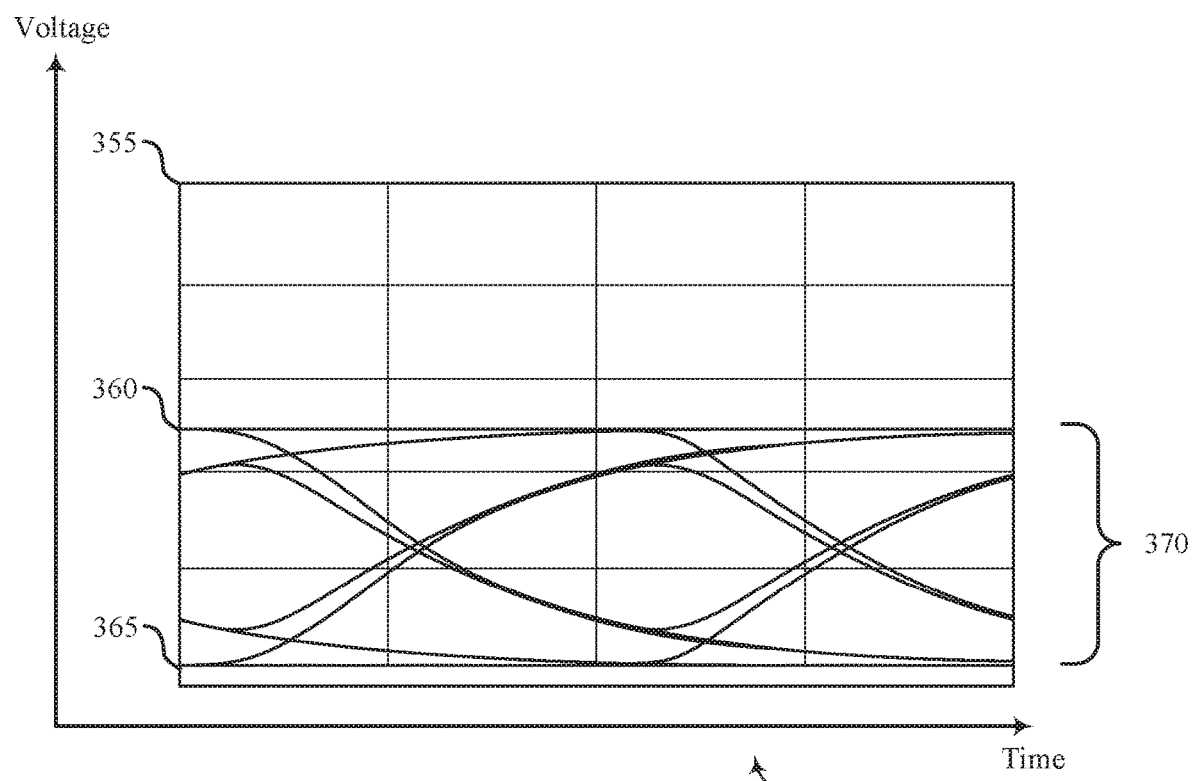
FIG. 3B illustrates an example of signals associated with multi-voltage operation for driving a multi-mode channel in accordance with examples as disclosed herein.

FIG. 3B illustrates an example of an eye diagram 350 for signals in accordance with multi-voltage operation for driving a multi-mode channel as disclosed herein. The eye diagram 350 illustrates an example of signaling 370 over the channel when the channel 325 is in terminated mode as described with reference to the system 300 illustrated in FIG. 3A.

As shown in eye diagram 350, when the channel 325 is terminated, the signaling 370 may vary from a lower bound 365 to an upper bound 360 and thus may have a voltage swing (range) equal to the difference between the upper bound 360 and the lower bound 365. When the driver 345 drives the channel 325 low, no (or de minimis) current may flow through the termination impedance 340 or the pull-down impedance 335 because the lower voltage supply (lower rail) of driver 345 is at the same voltage as the voltage reference to which the termination impedance 340 is coupled (VSS), and thus no voltage drop may occur across the termination impedance 340 or pull-down impedance 335. Accordingly, the lower bound 365 may correspond to (e.g., be equal to or be approximately equal to) the lower rail or voltage supply of driver 345 (VSS).

When the driver 345 drives the channel 325 high, however, current may flow through the termination impedance 340 and the pull-up impedance 330 due to the voltage differential between the upper voltage supply (upper rail) of driver 345 (VDD_1) and the voltage reference to which the termination impedance 340 is coupled (VSS). Thus, when the driver 345 drives the channel 325 high, a voltage drop may occur across both the pull-up impedance 330 and the termination impedance 340. Accordingly, the upper bound 360 may be less than VDD_1, as shown in eye diagram 350 (in which VDD_1 is illustrated as voltage 355). For example, the pull-up impedance 330 and the termination impedance 340 may form a voltage divider, and the upper bound 360 may be based on a relationship (ratio) between the respective impedances of the pull-up impedance 330 and the termination impedance 340—e.g., the upper bound 360 may be equal to a fraction of VDD_1, where (i) the numerator of the fraction is the impedance of the termination impedance 340 and (ii) the denominator of the fraction is the sum of (combined impedance of) the impedance of the pull-up impedance 330 and the impedance of the termination impedance 340. Thus, for example, where the pull-up impedance 330 and the termination impedance 340 each have a same impedance, the upper bound 360 may be one half ($\frac{1}{2}$) of VDD_1.

Though the system 300 and the eye diagram 350 are illustrated and described in the context of a low-level terminated mode, one of ordinary skill will appreciate that the systems and techniques described herein may similarly be applied to a high-level terminated mode, in which case the signaling 370 may have the same voltage swing (range) but with a lower bound equal to a voltage at the upper bound 360 and an upper bound equal to voltage 355 (VDD_1). Further, although the system 300 is illustrated with one channel 325, the components and techniques described herein may be applied to an interface that includes any quantity of channels 325.

Figure 4A:
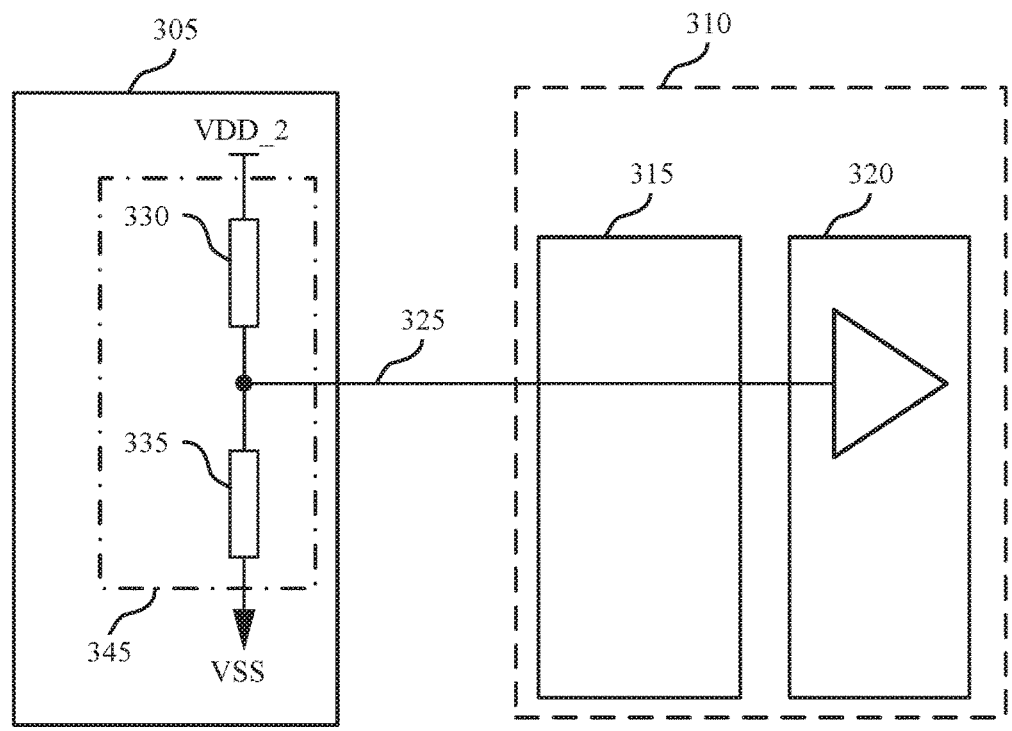
FIG. 4A illustrates an example of a system that supports multi-voltage operation for driving a multi-mode channel in accordance with examples as disclosed herein.

FIG. 4A illustrates an example of the system 300 when the channel 325 is operating (configured) in an unterminated mode. For example, when the channel 325 is in the unterminated mode, the termination component 315 may decouple the termination impedance 340 from the channel 325 (or decouple the termination impedance 340 from the voltage reference to which the termination impedance 340 is coupled when the channel 325 is in the terminated mode). Thus, unlike FIG. 3A, FIG. 4A illustrates the system 300 without the termination impedance 340 shown, as it may be electrically isolated from the illustrated aspects of the system 300.

The voltage of the voltage supply for the driver 345 (or another voltage reference related to the driver's output voltage) may be adjusted (set, configured) based on the impedance of the channel 325, such as whether the channel 325 is in the terminated mode or the unterminated mode. For example, as previously described with reference to FIG. 3A, when the channel 325 is in the terminated mode, the voltage supply for the driver 345 may be set to a first voltage referred to as VDD_1. And when the channel 325 is in the unterminated mode, the voltage supply for the driver 345 may be set to a second voltage, which may be referred to as VDD_2. In some cases, the second voltage (VDD_2) may be lower than the first voltage (VDD_1). For example, VDD_2 may in some cases be equal to the upper bound 360 of the signaling 370 when the channel 325 is in the terminated mode.

Figure 4B:
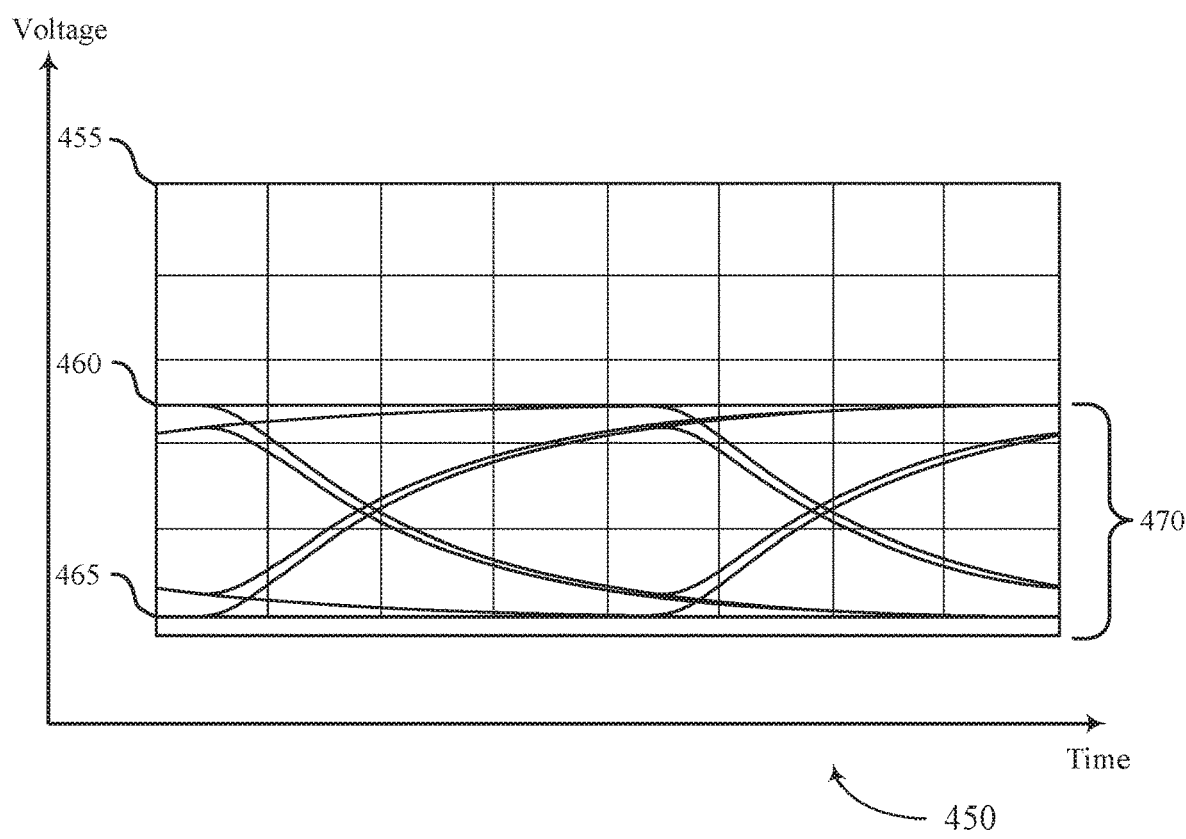
FIG. 4B illustrates an example of signals associated with multi-voltage operation for driving a multi-mode channel in accordance with examples as disclosed herein.

The different voltages supplied to the driver 345 may result in similar voltage levels (ranges, upper bounds) on the channel 325 for both unterminated and terminated operation as described further with reference to FIG. 4B. For example, VDD_2 and VDD_1 may both be configured such that, whether the channel 325 is terminated or unterminated, the voltage of signaling over the channel 325 remains lower than a threshold (e.g., a maximum operating voltage of the channel 325, such as a limit imposed by an industry standard or based on a voltage tolerance of one or more components of the receiving device 310. Additional factors that may influence the value of the second voltage (VDD_2), including relative to the first voltage (VDD_1), may include speed or data rate metrics for the system 300, power consumption metrics for the system 300, or any combination thereof.

Thus, the channel 325 may be operated with two voltages (e.g., supply voltages) for the driver 345, such that when the channel 325 is unterminated, the voltages on the channel 325 are substantially lower than the voltage for the driver 345 when the channel 325 is terminated. For example, when the channel 325 is unterminated, the voltages on the channel 325 may be less than or equal to half of the supply voltage for the driver 345 when the channel 325 is terminated (e.g., may have an upper bound that is less than or equal to one half VDD_1).

In some cases, the transmitting device 305 may generate both VDD_1 and VDD_2. In some cases, the transmitting device 305 may receive VDD_1 (e.g., via a pin, such as a VDDQ pin), and may generate VDD_2 when the channel 325 is in the unterminated mode (e.g., based on down-converting VDD_1). In some cases, the transmitting device 305 may receive VDD_1 (e.g., via a pin) when the channel 325 is in the terminated mode and receive VDD_2 (e.g., via the pin) when the channel 325 is in the unterminated mode—in such cases, another device (e.g., the receiving device 310) may adjust a power supply external to the transmitting device 305 in order to change between VDD_1 and VDD_2.

In some cases, the voltages for one or both of VDD_1 and VDD_2 may be configured by the receiving device 310 or another component of the system 300 (e.g., another processor or controller) programmable, either dynamically or as part of a boot sequence. For example, the transmitting device 305 may receive signaling, execute a fuse load procedure, or otherwise receive (obtain) an indication of one or both of VDD_1 and VDD_2 and may store the corresponding values in one or more mode registers.

In some cases, the transmitting device 305 may receive signaling (e.g., over the channel 325 if the channel 325 is bidirectional, or over another channel) from the receiving device 310 that indicates a change from the channel being terminated to being unterminated, or vice versa. The indication may be or include an indication of a data rate, modulation scheme, driver supply voltage, or other parameter associated with operating the channel 325 in the mode to which the channel 325 is being changed. In some examples, the data rate of communications over the channel 325 may decrease when the channel 325 changes to an unterminated mode and may increase when the channel 325 changes to a terminated mode.

In some examples, an impedance (e.g., output impedance) of the driver 345 may be configurable (e.g., dynamically adjustable). For example, the driver 345 may be configured such that one or both of pull-up impedance 330 and pull-down impedance 335 have a higher impedance when the channel 325 is operating in an unterminated (or other higher impedance) mode than when operating in a terminated (or other lower impedance) mode. This may allow for (at least improved) impedance matching between the driver 345 and the channel 325 as the impedance of the channel 325 changes. In some cases, this may further eliminate or mitigate an increase in capacitance of a pin or other aspect of the channel 325 (e.g., a pin of the transmitting device 305 or the receiving device 310 that may be included in the channel 325).

FIG. 4B illustrates an example of an eye diagram 450 in accordance with multi-voltage operation for driving a multi-mode channel as disclosed herein. The eye diagram 450 illustrates an example of signaling 470 over the channel when the channel 425 is in unterminated mode as described with reference to the system 400 illustrated in FIG. 4A.

As shown in eye diagram 350, when the channel 325 is terminated, the signaling 370 may vary from a lower bound 465 to an upper bound 460 and thus may have a voltage swing (range) equal to the difference between the upper bound 460 and the lower bound 465. When the driver 345 drives the channel 325 low, no (or de minimis) current may flow through the termination impedance 340 or the pull-down impedance 335 because there is an open circuit between the channel 325 and the voltage reference to which it was coupled in the terminated mode (setting aside parasitic effects). Accordingly, no voltage drop may occur across the termination impedance 340 or pull-down impedance 335, and the lower bound 465 may correspond to (e.g., be equal to or be approximately equal to) the lower rail or voltage supply of driver 345 (VSS).

Similarly, when the driver 345 drives the channel 325 high in unterminated mode, no (or de minimis) current may flow through the termination impedance 340 or the pull-up impedance 330, again because of an open circuit between the channel 325 and the voltage reference to which it was coupled in the terminated mode (setting aside parasitic effects). Accordingly, no voltage drop may occur across the termination impedance 340 or pull-up impedance 330, and the upper bound 460 may correspond to (e.g., be equal to or be approximately equal to) the upper rail or voltage supply of driver 345 (VDD).

Thus, when the channel 325 is unterminated, the upper bound 460 may be equal to the voltage of the voltage supply for the driver 345. Accordingly, if the voltage of the voltage supply for the driver 345 is adjusted to be below a threshold when the channel 325 is unterminated (e.g., below a maximum operating voltage for the channel 325, such as a voltage tolerance for one or more transistors included in the receiving device 310), then the upper bound 460 may be below the threshold. Further, if when the channel 325 is unterminated, the adjusted (decreased) voltage of the voltage supply for the driver 345 (VDD_2) is configured to be equal to the upper bound 360 (associated with operating the channel in terminated mode), then the upper bound 460 may be equal to the upper bound 360. Additionally or alternatively, signaling over the channel 325 may have the same voltage swing (e.g., same upper bound, same lower bound, same range) when the channel is unterminated as when the channel is terminated. Accordingly, the receiving device 310 (e.g., receiving component 320) may monitor the channel 325 for signaling having the same voltage swing (or any quantity of same voltage levels, such as a same upper bound and same lower bound) when the channel is unterminated as when the channel is terminated.

Though the system 300 and the eye diagram 450 are illustrated and described in the context of a low-level terminated mode, one of ordinary skill will appreciate that the systems and techniques described herein may similarly be applied to a high-level terminated mode, in which case the signaling 470 may have the same voltage swing (range) but with a lower bound equal to a voltage at the upper bound 460 and an upper bound equal to voltage 455. Further, although the system 300 is illustrated with one channel 325, the components and techniques described herein may be applied to an interface that includes any quantity of channels 325.

Further, though the system 300 and the eye diagrams 350, 450 are illustrated and described in the context of the channel 325 changing between a first mode in which the channel 325 is terminated and a second mode in which the channel 325 is unterminated, the teachings herein may be applied to any quantity of modes corresponding to any quantity of various termination impedances 340 for the channel 325.

Further, though the system 300 and the eye diagrams 350, 450 are illustrated and described in the context of a supply voltage for the driver 345 being adjusted based on the mode of the channel 325, the teachings herein may be applied to adjust one or more other voltages associated with the driver 345 to maintain desired voltage levels over the channel 325.

Figure 5A:
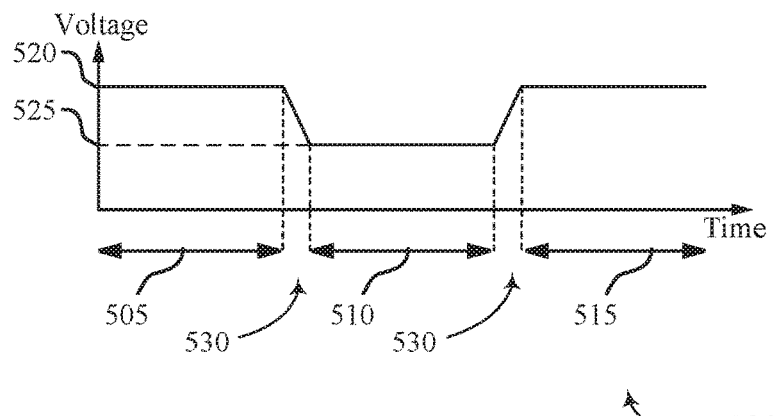
FIG. 5A illustrates an example of a timing diagram associated with multi-voltage operation for driving a multi-mode channel in accordance with examples as disclosed herein.

FIG. 5A illustrates an example of a timing diagram 500 in accordance with multi-voltage operation for driving a multi-mode channel as disclosed herein. The timing diagram 500 may illustrate how the voltage of a voltage supply for a driver 345 may be adjusted over time depending on the mode (e.g., terminated versus unterminated) of a channel 325 driven by the driver 345.

FIG. 5A includes three periods, period 505, period 510, and period 515, in which a period may be a duration of time. During periods 505 and 515, the channel may be in a first (e.g., terminated, low impedance) mode, and the supply voltage for a driver 345 may be at a first voltage 520 (e.g., VDD_1 as described with reference to FIGS. 3 and 4).

During period 510, the channel may be in a second (e.g., unterminated, high impedance) mode, and the supply voltage for the driver 345 may be at a second voltage 525 (e.g., VDD_2 as described with reference to FIGS. 3 and 4). The second voltage 525 may be lower than the first voltage 520 (e.g., some fraction of VDD_1, such as half of VDD_1). Thus, the supply voltage for the driver 345 may be adjusted (e.g., decreased) when the channel 325 is in the unterminated mode versus when the channel 325 is in the terminated mode.

Further illustrated in FIG. 5A are gaps 530 between the periods 505 and 510 and also between the periods 510 and 515. Gaps 530 may correspond to an elapsed time associated with switching the channel 325 between the first mode and the second mode, adjusting the voltage supply for the driver 345 from the first voltage 520 to the second voltage 525 (or vice versa), or both. As the voltage transitions between the first voltage 520 and the second voltage 525, the driver may refrain from generating and outputting signaling over the channel 325 (e.g., for the duration of a gap 530).

Figure 5B:
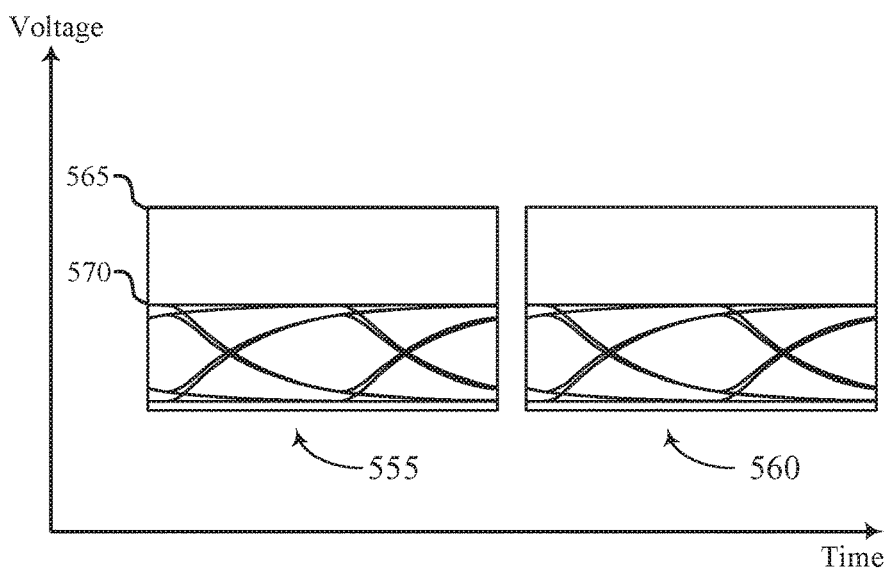
FIG. 5B illustrates an example of signals associated with multi-voltage operation for driving a multi-mode channel in accordance with examples as disclosed herein.

FIG. 5B illustrates eye diagrams 550, which include examples of signals in accordance with multi-voltage operation for driving a multi-mode channel as disclosed herein. Eye diagram 555 may be representative of signaling over the channel 325 when the channel 325 is in the first mode (e.g., during period 505 or 515), and eye diagram 560 may be representative of signaling over the channel 325 when the channel is in the second mode (e.g., during period 510).

As shown in FIG. 5B, changing (e.g., decreasing) the supply voltage for the driver 345 from the first voltage 520 to the second voltage 525 may cause the signaling over the channel 325 to have the same voltage swing (range), the same upper bound 570, or both when the channel 325 is in the second mode (e.g., unterminated) as when the channel 325 is in the first mode (e.g., terminated). Thus, the receiving device 310 may monitor for signaling having the same voltage swing (range), the same upper bound 570, or both regardless of whether the channel 325 is in the first mode or the second mode (e.g., terminated or unterminated), which may simplify the design of the receiving device 310, support the use of lower voltage tolerance components (e.g., transistors) at the receiving device 310, or both, along with other benefits. For example, in FIG. 5B, voltage 565 may be VDD_1 as described with reference to FIGS. 3 and 4, and a voltage at the upper bound 570 may be VDD_2 as described with reference to FIGS. 3 and 4. The upper bound of the signaling over the channel 325 may, for example, be at the voltage at the upper bound 570 when the channel 325 is unterminated as well as when the channel 325 is unterminated.

Figure 5C:
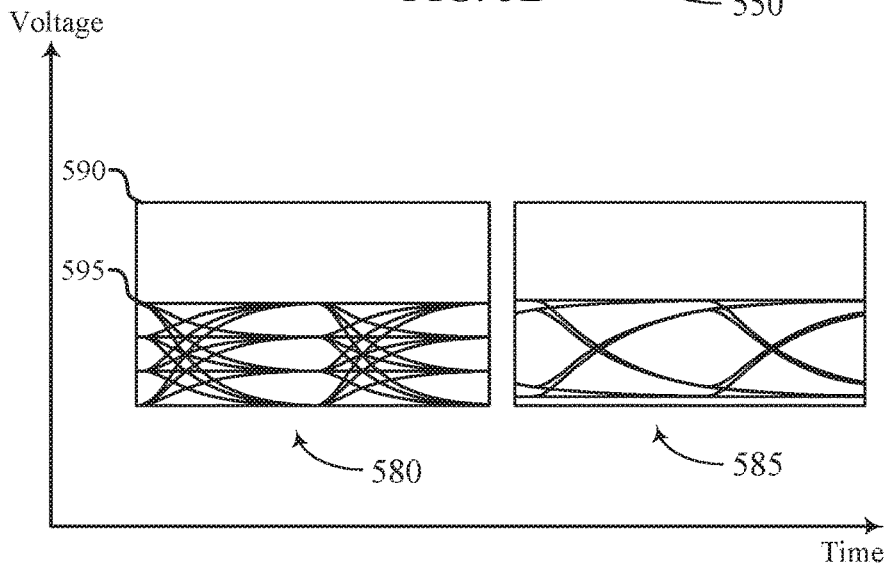
FIG. 5C illustrates an example of signals associated with multi-voltage operation for driving a multi-mode channel in accordance with examples as disclosed herein

FIG. 5C illustrates eye diagrams 575, which include additional examples of signals in accordance with multi-voltage operation for driving a multi-mode channel as disclosed herein. Eye diagram 580 may be representative of signaling over the channel 325 when the channel 325 is in the first mode (e.g., during period 505 or 515), and eye diagram 585 may be representative of signaling over the channel 325 when the channel is in the second mode (e.g., during period 510).

As shown in FIG. 5C, changing (e.g., decreasing) the supply voltage for the driver 345 from the first voltage 520 to the second voltage 525 may cause the signaling over the channel 325 to have the same voltage swing (range), the same upper bound 595, or both when the channel 325 is in the second mode (e.g., unterminated) as when the channel 325 is in the first mode (e.g., terminated). Thus, the receiving device 310 may monitor for signaling having the same voltage swing (range), the same upper bound 595, or both regardless of whether the channel 325 is in the first mode or the second mode (e.g., terminated or unterminated), which may simplify the design of the receiving device 310, support the use of lower voltage tolerance components (e.g., transistors) at the receiving device 310, or both, along with other benefits. For example, in FIG. 5C, voltage 590 may be VDD_1 as described with reference to FIGS. 3 and 4, and a voltage at the upper bound 595 may be VDD_2 as described with reference to FIGS. 3 and 4. The upper bound of the signaling over the channel 325 may, for example, be at the voltage at the upper bound 595 when the channel 325 is unterminated as well as when the channel 325 is unterminated.

In some cases, signaling over the channel 325 may occur with a higher data rate when the channel 325 is terminated relative to a lower data rate when the channel is unterminated. In some examples, the higher data rate may be achieved by an increase in the order of modulation used for signaling over the channel 325. For example, as discussed above, operating the channel 325 in the terminated mode may provide signal integrity and related benefits, and thus a higher data rate may be supported by the channel 325 when in the terminated mode. Conversely, as also discussed above, operating the channel 325 in an unterminated mode may provide power efficiency and related benefits, and thus an unterminated channel 325 may be utilized during a lower power or idle mode to save power while still supporting signaling, though perhaps at a reduced data rate. Accordingly, a terminated mode for the channel 325 may in some cases correspond to or be referred to as a high-speed, high-performance, or high-power mode, and an unterminated mode for the channel 325 may in some cases correspond to or be referred to as a low-speed, low-performance, or low-power mode.

An increased data rate when the channel 325 is in the terminated mode—relative to when the channel 325 is in the unterminated mode—may be achieved by an increased symbol (baud) rate over the channel 325, an increase in the order of modulation used for signaling over the channel 325, or both. Thus, in some cases, the receiving device 310 may indicate to the transmitting device 305 a change in mode of the channel 325 based on indicating a change in data rate over the channel 325 (e.g., indicating a target data rate that is above or below a threshold, or a target data rate that differs from a current (present) data rate or range of data rates). Similarly, the transmitting device 305 may change the mode of the channel 325 based on changing (e.g., determining to change) or receiving an indication of a change in data rate over the channel 325.

As indicated above, the modulation scheme may in some cases switch from a lower order of modulation (e.g., binary) to a higher order of modulation (e.g., non-binary) or vice versa based on the mode of the channel 325 (e.g., to achieve a change in data rate). For example, as shown in eye diagram 580, the driver 345 may output signaling over the channel 325 using a first modulation scheme (e.g., PAM4) while the channel is in a first (e.g., terminated) mode. And as shown in eye diagram 585, the driver 345 may output signaling over the channel 325 using a second modulation scheme (e.g., NRZ or PAM2) while the channel is in a second (e.g., unterminated) mode. The first modulation scheme may be of a higher order than the second modulation scheme, and thus the first modulation scheme may be, for example, a PAM3 modulation scheme or a PAM4 modulation scheme with at least three voltage levels. The second modulation scheme may be, for example, a PAM2 modulation scheme or an NRZ modulation scheme. Thus, in some examples, a receiving device 310 may monitor the channel 325 for signaling corresponding to a first order of modulation while the channel 325 has a first impedance, and the receiving device 310 may monitor the channel 325 for signaling corresponding to a second order of modulation while the channel 325 a second impedance.

Additionally, the transmitting device 305 and the receiving device 310 may exchange signaling to indicate the mode of the channel 325 (e.g., to indicate switching between the first mode and the second mode). In some cases, the indication may be or include an indication of a decrease in a data rate over the channel 325. Signaling to indicate the mode of the channel 325 may be transmitted over the channel 325 (where the channel 325 is bidirectional) or over one or more other channels (e.g., the channel 325 may be a DQ channel 190, and the indication may be transmitted over one or more C/A channels 186).

Figure 6:
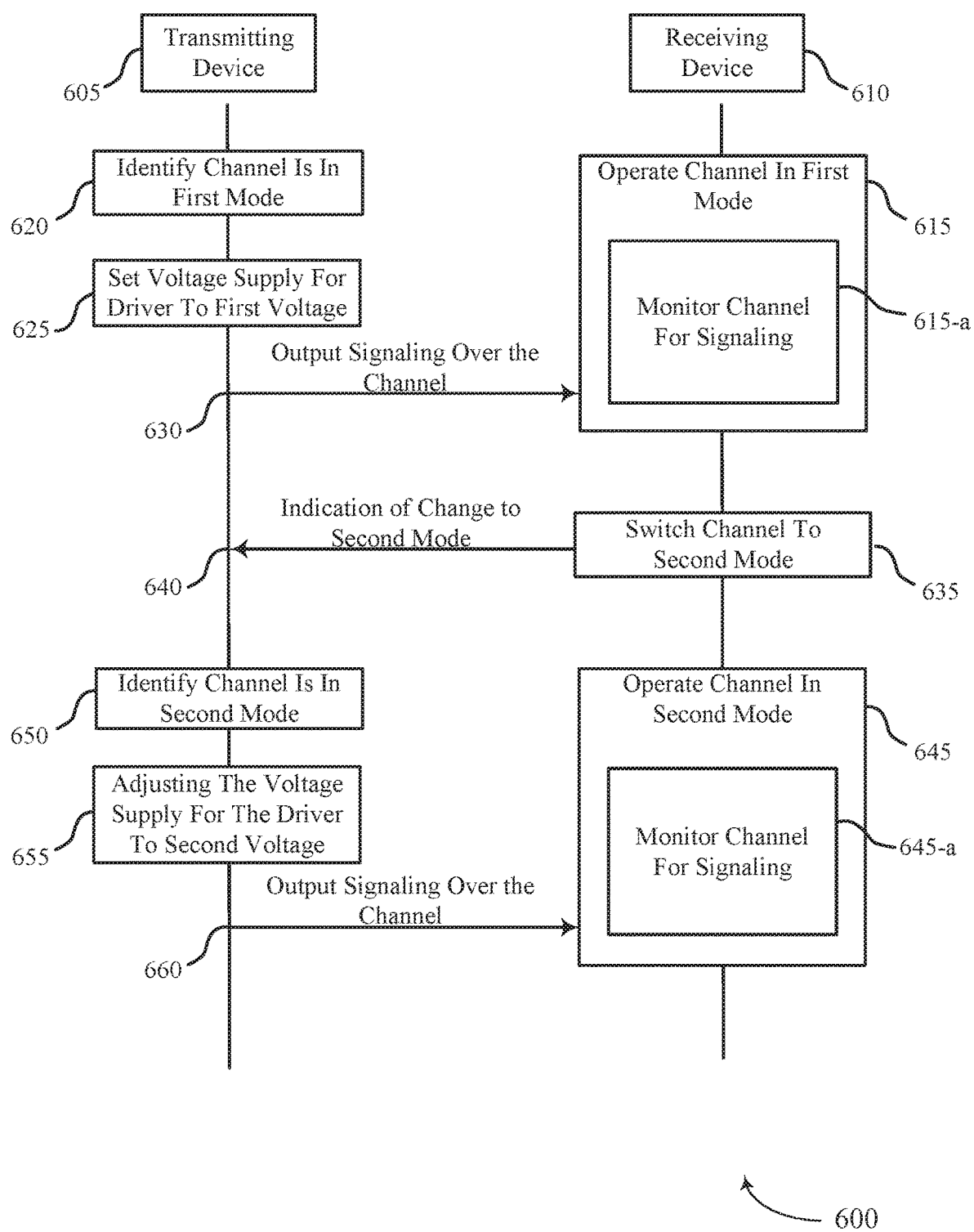
FIG. 6 illustrates an example of a process flow that supports multi-voltage operation for driving a multi-mode channel in accordance with examples as disclosed herein.

FIG. 6 illustrates an example of a process flow 600 that supports multi-voltage operation for driving a multi-mode channel in accordance with examples as disclosed herein. The process flow 600 may illustrate functions of and communications between a transmitting device 605 and a receiving device 610. The transmitting device 605 and receiving device 610 may be coupled with and communicate with one another via a channel. The transmitting device 605 and receiving device 610 may respectively be examples of a transmitting device 305 and a receiving device 310 as described with reference to FIGS. 3-5. For example, the transmitting device 305 may be a memory device 110, and the receiving device may be a host device (e.g., external memory controller 105) for the memory device 110, or vice versa.

At 615, the receiving device 610 may operate the channel in a first mode. In the first mode, the channel may have a first impedance. For example, the channel may be terminated when operated in the first mode. In some cases, the first mode may correspond to a first operating mode of a system that includes the receiving device 610, such as a high-speed, high-performance, or high-power mode of the system.

At 615-a, while operating the channel in the first mode, the receiving device 610 may monitor the channel for signaling in accordance with the first mode. Signaling in accordance with the first mode may include signaling having a first voltage swing (range, upper bound and lower bound). Additionally or alternatively, signaling in accordance with the first mode may include signaling having a first date rate over the channel (e.g., above a threshold data rate). Additionally or alternatively, signaling in accordance with the first mode may include signaling modulated according to a first modulation scheme (e.g., a higher-order, non-binary modulation scheme such as PAM3 or PAM4, which may support the first data rate being above the threshold).

At 620, the transmitting device 605 may identify that the channel is operating in the first mode. In some cases, the transmitting device 605 may identify that the channel is operating in the first mode based on one or more signals received by the transmitting device 605 (e.g., from the receiving device 610). For example, the transmitting device 605 may receive an indication of the mode of the channel via one or more other channels (e.g., the channel may be a DQ channel 190, and the transmitting device 605 may receive the indication of the mode of the channel via a C/A channel 186). In some cases, the indication of the mode of the channel may be an indication of a target or requested data rate for the channel (e.g., a requested data rate that is above the threshold data rate). In some cases (not shown), the transmitting device 605 may control the mode the of the channel and may indicate the mode of the channel to the receiving device 610.

At 625, based on the channel being in the first mode, the transmitting device 605 may set a voltage supply for a driver to a first voltage (e.g., VDD_1) corresponding to the first mode, which may support signaling having the first voltage swing. The transmitting device 305 may also configure the driver to generate and output over the channel signaling in accordance with the first mode (e.g., in accordance with the first modulation scheme, having the first data rate). In some cases, based on the channel being in the first mode, the transmitting device 305 may also set an output impedance of the driver to a first output impedance corresponding to the first mode.

At 630, the transmitting device 605 may output signaling over the channel that is in accordance with the first mode, which may be received by the receiving device 610.

At 635, the receiving device 610 may switch the channel to a second mode. In the second mode, the channel may have a second impedance, which may be higher than the first impedance. For example, the channel may be unterminated when operated in the second mode. In some cases, the second mode may correspond to a second operating mode of the system that includes the receiving device 610, such as a low-speed, low-performance, or low-power mode of the system.

At 640, receiving device 610 may transmit to the transmitting device 605 indication of the change to the second mode. In some cases, the indication of the change to the second mode may be an indication of a second data rate, second modulation scheme, or any other characteristic associated with the second mode. The indication may be transmitted at 640 over a different channel (e.g., a C/A channel 186) than the channel being changed to the second mode. In some cases (not shown), the transmitting device 605 may control the mode the of the channel and may switch the channel to the second mode and indicate the change to the second mode to the receiving device 610.

At 645, the receiving device 610 may operate the channel in the second mode.

At 645-a, while operating the channel in the second mode, the receiving device 610 may monitor the channel for signaling in accordance with the second mode. Signaling in accordance with the second mode may include signaling having a second voltage swing (range, upper bound and lower bound) that may be the same as the first voltage swing. Additionally or alternatively, signaling in accordance with the second mode may have an upper bound that is below a threshold, where signaling in accordance with the first mode has an upper bound that is also below the threshold.

Additionally or alternatively, signaling in accordance with the second mode may include signaling having a second date rate over the channel (e.g., below the threshold data rate, or otherwise lower than the first data rate). Additionally or alternatively, signaling in accordance with the second mode may include signaling modulated according to a second modulation scheme, which may be of a lower order than the first modulation scheme (e.g., the second modulation scheme may be a binary modulation scheme such as PAM2 or NRZ, which may correspond to the second data rate being lower than the first data rate). Additionally or alternatively, signaling in accordance with the second mode may have a second baud rate, where signaling in accordance with the first mode may have a first (e.g., higher) baud rate.

At 650, the transmitting device 605 may identify that the channel is operating in the second mode. In some cases, the transmitting device 605 may identify that the channel is operating in the second mode based on the indication received at 640.

At 655, based on the channel being in the first mode, the transmitting device 605 may adjust (set) the voltage supply for the driver to a second voltage (e.g., VDD_2) corresponding to the second mode. The second voltage may be lower than the first voltage. Setting the voltage supply for the driver to the second voltage may support signaling over the channel, while the channel is in the second mode, with an upper bound (e.g., voltage swing) that is below a voltage threshold (e.g., a maximum operating voltage for the channel). In some cases, the second voltage may be equal to an upper bound of the signaling output at 630 (when the channel was operating in the first mode). Additionally or alternatively, the second voltage may be half of the first voltage. The transmitting device 305 may also configure the driver to generate and output over the channel signaling in accordance with the second mode (e.g., in accordance with the second modulation scheme, having the second data rate).

In some cases, based on the channel being in the second mode, the transmitting device 305 may also set an output impedance of the driver to a second output impedance corresponding to the second mode, which may be higher than the first output impedance corresponding to the first mode.

At 660, the transmitting device 605 may output signaling over the channel that is in accordance with the second mode, which may be received by the receiving device 610.

Though the example process flow 600 illustrates the channel switching from the first mode to the second mode, and the voltage supply for the driver correspondingly switching from the first voltage to the second voltage, it is to be understood that channel may also switch from the second mode to the first mode, and the voltage supply for the driver may correspondingly switch from the second voltage to the first voltage. Further, though the example process flow 600 illustrates the channel switching mode one time and the voltage supply for the driver correspondingly switching voltage one time, it is to be understood that the mode of the channel and the voltage of the voltage supply may change any quantity of times. Similarly, in any quantity of modes for the channel (e.g., any quantity of combinations of various channel impedances, data rates over the channel, modulation schemes for signaling over the channel) may be possible, along with any quantity of corresponding voltages for the voltage supply for the driver.

Figure 7:
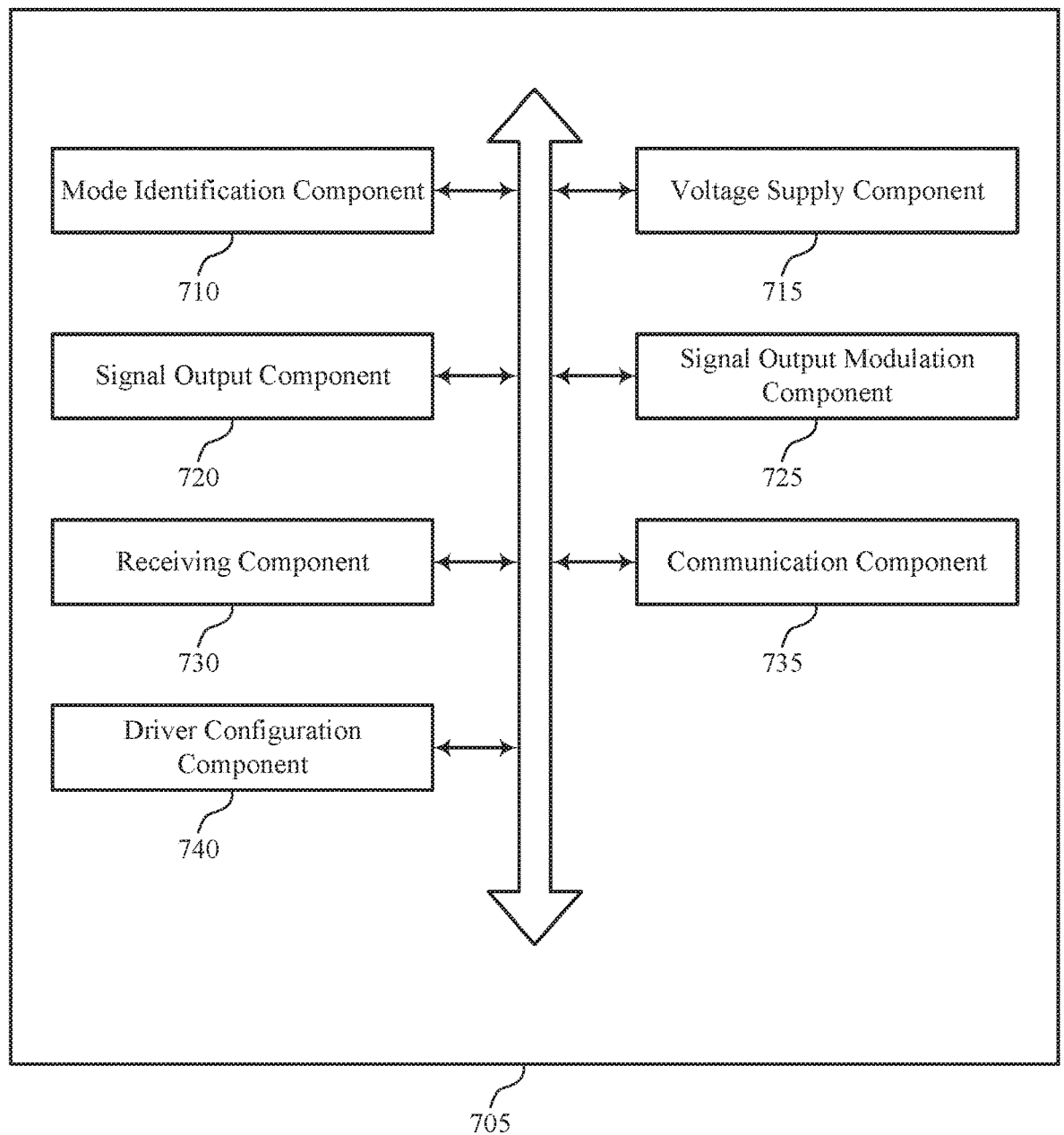
FIG. 7 shows a block diagram of a device that supports multi-voltage operation for driving a multi-mode channel in accordance with aspects of the present disclosure.

FIG. 7 shows a block diagram 700 of a device 705 that supports multi-voltage operation for driving a multi-mode channel in accordance with examples as disclosed herein. The device 705 may be an example of aspects of a memory system or other computing system as described with reference to FIGS. 1-6, such as a transmitting device 305. The device 705 may include a mode identification component 710, a voltage supply component 715, a signal output component 720, a signal output modulation component 725, a receiving component 730, a communication component 735, and a driver configuration component 740. Each of these modules may communicate, directly or indirectly, with one another (e.g., via one or more buses).

The mode identification component 710 may identify that a channel between a first device (device 705) and a second device is in a first mode in which the channel is terminated. In some examples, the first device may be a memory device and the second device may be a host device coupled with the memory device. The voltage supply component 715 may set a voltage supply for a driver coupled with the channel to a first voltage based on the channel being terminated. In some examples, the first device may be a memory device and the second device may be a host device which may be coupled with the memory device.

In some examples, the mode identification component 710 may identify, after the voltage supply component 715 sets the voltage supply to the first voltage, that the channel is in a second mode in which the channel is unterminated. In some examples, the mode identification component 710 may identify that the channel is changing from the first mode to the second mode. In some examples, the voltage supply component 715 may adjust, based on the channel being unterminated, the voltage supply for the driver to a second voltage that is lower than the first voltage. In some examples, the second voltage may be half of the first voltage. In some examples, the first mode may correspond to a first impedance between the channel and a voltage reference, the second mode may correspond to a second impedance between the channel and the voltage reference, the second impedance greater than the first impedance, and the second voltage may be based at least in part on the first impedance and an impedance of the driver. Additionally, in some examples, the voltage reference may be at a voltage lower than the second voltage.

The signal output component 720 may include the driver and may output, by the driver while the channel is in the first mode, signaling over the channel having a first voltage swing that is less than a threshold. In some examples, the signal output component 720 may output, by the driver while the channel is in the second mode and based on adjusting the voltage supply to the second voltage, signaling over the channel having a second voltage swing that is less than the threshold.

In some examples, the signal output component 720 may output, by the driver while the channel is in the first mode, signaling for the first mode that has an upper bound, where, adjusting the voltage supply for the driver to the second voltage includes setting the voltage supply equal to the upper bound of the signaling for the first mode. In some examples, the signal output component 720 may refrain from outputting, by the driver, signaling over the channel for a duration of time based on the channel changing from the first mode to the second mode.

The signal output modulation component 725 may output, by the driver while the channel is in the first mode, signaling over the channel using a first modulation scheme. In some examples, the signal output modulation component 725 may output, by the driver while the channel is in the second mode, signaling over the channel using a second modulation scheme. In some examples, the first modulation scheme may be of a higher order than the second modulation scheme. Additionally, in some examples, the first modulation scheme may be a pulse amplitude modulation three (PAM3) or a pulse amplitude modulation four (PAM4) modulation scheme and the second modulation scheme may be a pulse amplitude modulation two (PAM2) or a non-return to zero (NRZ) modulation scheme.

The receiving component 730 may receive, at the first device, an indication of a change from the channel being in the first mode to the channel being in the second mode, where identifying that the channel is in the second mode is based on receiving the indication. In some examples, the indication of the change may indicate a data rate may be associated with the second mode.

The communication component 735 may communicate over the channel using a first data rate when the channel is in the first mode. In some examples, the communication component 735 may communicate over the channel using a second data rate that is lower than the first data rate when the channel is in the second mode.

The driver configuration component 740 may configure the driver to have a first impedance when the channel is terminated. In some examples, the driver configuration component 740 may configure the driver to have a second impedance when the channel is unterminated, the second impedance higher than the first impedance.

Figure 8:
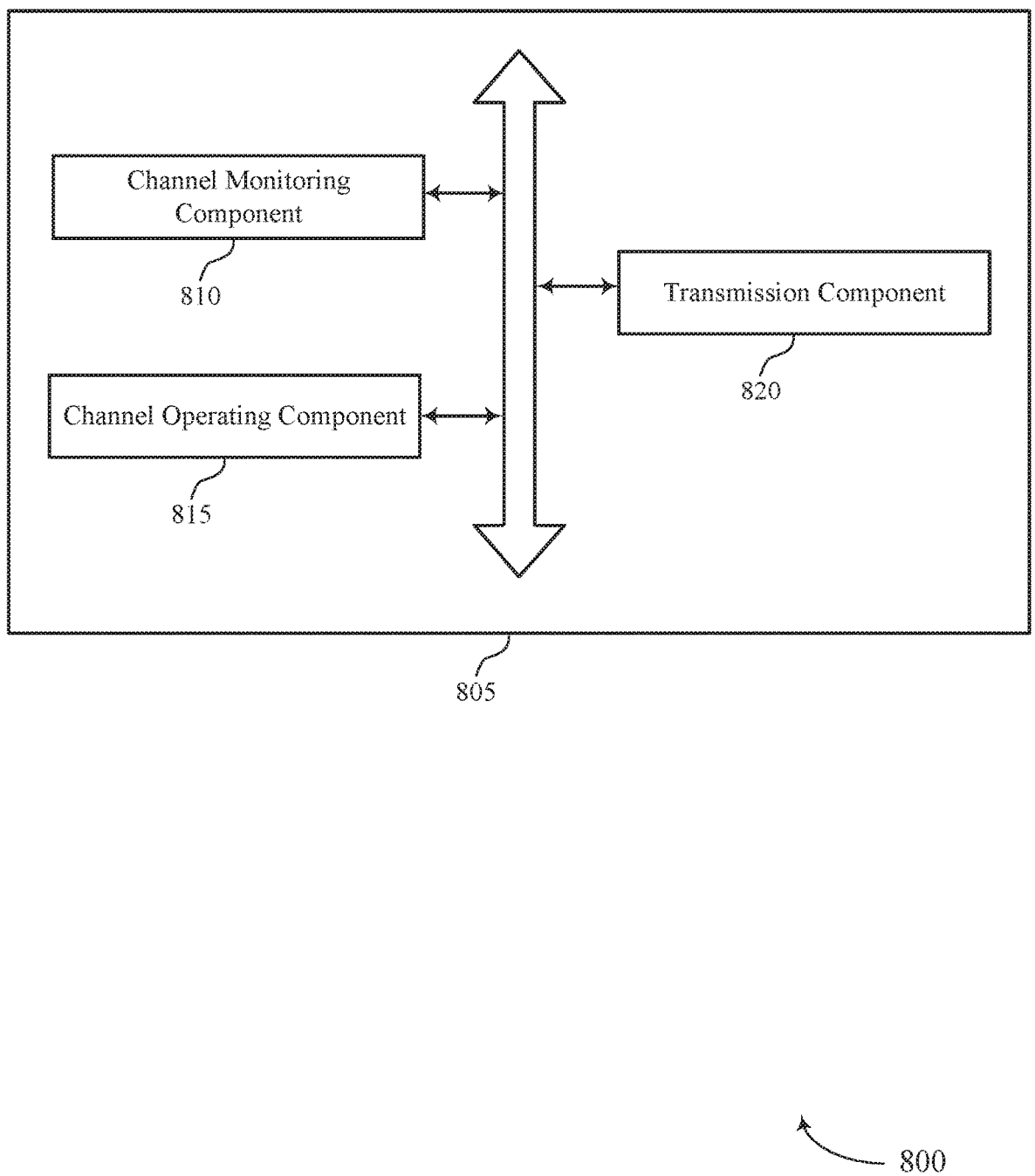
FIG. 8 shows a block diagram of a device that supports multi-voltage operation for driving a multi-mode channel in accordance with aspects of the present disclosure.

FIG. 8 shows a block diagram 800 of a device 805 that supports multi-voltage operation for driving a multi-mode channel in accordance with examples as disclosed herein. The device 805 may be an example of aspects of a memory system or other computing system as described with reference to FIGS. 1-6, such as a receiving device 310. The device 805 may include a channel monitoring component 810, a channel operating component 815, and a transmission component 820. Each of these modules may communicate, directly or indirectly, with one another (e.g., via one or more buses).

The channel monitoring component 810 may monitor a channel between a first device and a second device, while operating the channel with a first impedance, for signaling having a voltage swing. In some examples, the channel monitoring component 810 may monitor the channel, while operating the channel with the second impedance, for signaling having the voltage swing. In some examples, the channel monitoring component 810 may monitor the channel, while operating the channel with the first impedance, for signaling in accordance with a first order of modulation. In some examples, the channel monitoring component 810 may monitor the channel, while operating the channel with the second impedance, for signaling in accordance with a second order of modulation that is lower than the first order of modulation. In some examples, the signaling in accordance with the first order of modulation may include three or more voltage levels.

The channel operating component 815 may operate the channel (e.g. by controlling a termination component 315 as described with reference to FIG. 3A). In some examples, the channel operating component 815 may operating the channel with a first impedance when the channel is in a first mode and with a second impedance with the channel is in a second mode. In some cases, the channel operating component 815 may switch the channel to have a second impedance that is higher than the first impedance.

The transmission component 820 may transmit, to the second device, an indication of the switching from the first impedance to the second impedance. In some examples, the indication of the switching from the first impedance to the second impedance may include an indication of a decrease in a data rate over the channel. Additionally, in some examples, operating the channel with the first impedance may include operating the channel in a terminated mode and operating the channel with the second impedance may include operating the channel in an unterminated mode.

Figure 9:
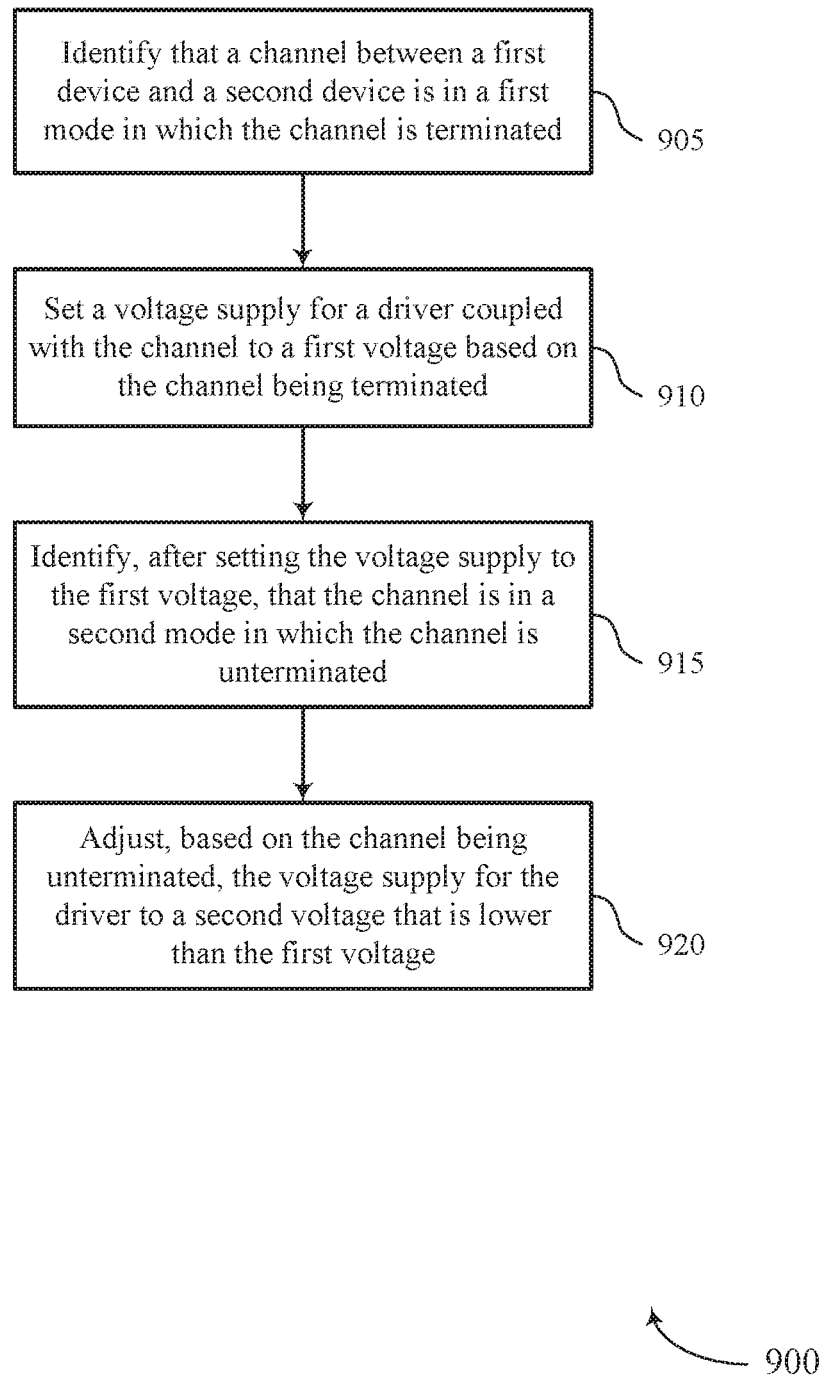
FIGS. 9 through 11 show flowcharts illustrating a method or methods that support multi-voltage operation for driving a multi-mode channel in accordance with examples as disclosed herein.

FIG. 9 shows a flowchart illustrating a method or methods 900 that supports multi-voltage operation for driving a multi-mode channel in accordance with aspects of the present disclosure. The operations of method 900 may be implemented by a device or its components as described herein. For example, the operations of method 900 may be performed by a device as described with reference to FIG. 7. In some examples, a device may execute a set of instructions to control the functional elements of the device to perform the described functions. Additionally or alternatively, a device may perform aspects of the described functions using special-purpose hardware.

At 905, the device may identify that a channel between a first device (e.g., the device) and a second device is in a first mode in which the channel is terminated. The operations of 905 may be performed according to the methods described with reference to FIGS. 3 through 6. In some examples, aspects of the operations of 905 may be performed by a mode identification component as described with reference to FIG. 7.

At 910, the device may set a voltage supply for a driver coupled with the channel to a first voltage based on the channel being terminated. The operations of 910 may be performed according to the methods described with reference to FIGS. 3 through 6. In some examples, aspects of the operations of 910 may be performed by a voltage supply component as described with reference to FIG. 7.

At 915, the device may identify, after setting the voltage supply to the first voltage, that the channel is in a second mode in which the channel is unterminated. The operations of 915 may be performed according to the methods described with reference to FIGS. 3 through 6. In some examples, aspects of the operations of 915 may be performed by a mode identification component as described with reference to FIG. 7.

At 920, the device may adjust, based on the channel being unterminated, the voltage supply for the driver to a second voltage that is lower than the first voltage. The operations of 920 may be performed according to the methods described with reference to FIGS. 3 through 6. In some examples, aspects of the operations of 920 may be performed by a voltage supply component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for identifying that a channel between a first device (e.g., the apparatus) and a second device is in a first mode in which the channel is terminated, setting a voltage supply for a driver coupled with the channel to a first voltage based on the channel being terminated, identifying, after setting the voltage supply to the first voltage, that the channel is in a second mode in which the channel is unterminated, and adjusting, based on the channel being unterminated, the voltage supply for the driver to a second voltage that is lower than the first voltage.

Some examples of the method 900 and the apparatus described herein may further include operations, features, means, or instructions for outputting, by the driver while the channel may be in the first mode, signaling over the channel having a first voltage swing that may be less than a threshold, and outputting, by the driver while the channel may be in the second mode and based on adjusting the voltage supply to the second voltage, signaling over the channel having a second voltage swing that may be less than the threshold.

Some examples of the method 900 and the apparatus described herein may further include operations, features, means, or instructions for outputting, by the driver while the channel may be in the first mode, signaling for the first mode that may have an upper bound, where adjusting the voltage supply for the driver to the second voltage comprises setting the voltage supply equal to the upper bound of the signaling for the first mode.

In some examples of the method 900 and the apparatus described herein, the second voltage may be half of the first voltage.

Some examples of the method 900 and the apparatus described herein may further include operations, features, means, or instructions for outputting, by the driver while the channel may be in the first mode, signaling over the channel using a first modulation scheme, and outputting, by the driver while the channel may be in the second mode, signaling over the channel using a second modulation scheme.

In some examples of the method 900 and the apparatus described herein, the first modulation scheme may be of a higher order than the second modulation scheme.

In some examples of the method 900 and the apparatus described herein, the first modulation scheme may be a pulse amplitude modulation three (PAM3) or a pulse amplitude modulation four (PAM4) modulation scheme, and the second modulation scheme may be a pulse amplitude modulation two (PAM2) or a non-return to zero (NRZ) modulation scheme.

Some examples of the method 900 and the apparatus described herein may further include operations, features, means, or instructions for receiving, at the first device, an indication of a change from the channel being in the first mode to the channel being in the second mode, where identifying that the channel is in the second mode may be based on receiving the indication.

In some examples of the method 900 and the apparatus described herein, the indication of the change indicates a data rate associated with the second mode.

Some examples of the method 900 and the apparatus described herein may further include operations, features, means, or instructions for communicating over the channel using a first data rate when the channel is in the first mode, and communicating over the channel using a second data rate that may be lower than the first data rate when the channel is in the second mode.

In some examples of the method 900 and the apparatus described herein, the first mode corresponds to a first impedance between the channel and a voltage reference, the second mode corresponds to a second impedance between the channel and the voltage reference, the second impedance greater than the first impedance, and the second voltage may be based on the first impedance and an impedance of the driver.

In some examples of the method 900 and the apparatus described herein, the voltage reference may be at a voltage lower than the second voltage.

Some examples of the method 900 and the apparatus described herein may further include operations, features, means, or instructions for configuring the driver to have a first impedance when the channel is terminated, and configuring the driver to have a second impedance when the channel is unterminated, the second impedance higher than the first impedance.

Some examples of the method 900 and the apparatus described herein may further include operations, features, means, or instructions for identifying that the channel is changing from the first mode to the second mode, and refraining from outputting, by the driver, signaling over the channel for a duration of time (e.g., a guard period) based on the channel changing from the first mode to the second mode.

In some examples of the method 900 and the apparatus described herein, the first device may be a memory device and the second device may be a host device coupled with the memory device.

Figure 10:
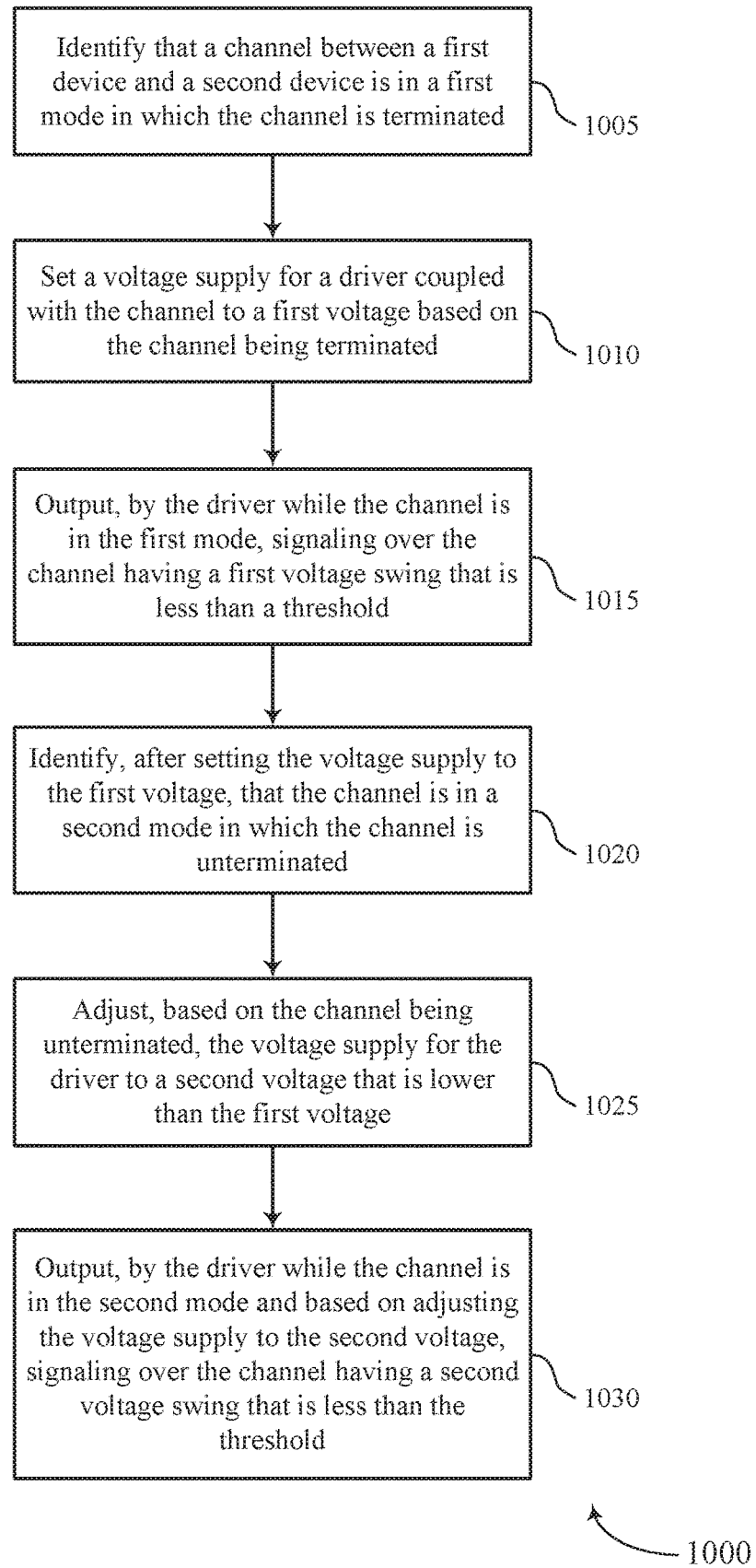

FIG. 10 shows a flowchart illustrating a method or methods 1000 that supports multi-voltage operation for driving a multi-mode channel in accordance with aspects of the present disclosure. The operations of method 1000 may be implemented by a device or its components as described herein. For example, the operations of method 1000 may be performed by a device as described with reference to FIG. 7. In some examples, a device may execute a set of instructions to control the functional elements of the device to perform the described functions. Additionally or alternatively, a device may perform aspects of the described functions using special-purpose hardware.

At 1005, the device may identify that a channel between a first device and a second device is in a first mode in which the channel is terminated. The operations of 1005 may be performed according to the methods described with reference to FIGS. 3 through 6. In some examples, aspects of the operations of 1005 may be performed by a mode identification component as described with reference to FIG. 7.

At 1010, the device may set a voltage supply for a driver coupled with the channel to a first voltage based on the channel being terminated. The operations of 1010 may be performed according to the methods described with reference to FIGS. 3 through 6. In some examples, aspects of the operations of 100 may be performed by a voltage supply component as described with reference to FIG. 7.

At 1015, the device may output, by the driver while the channel is in the first mode, signaling over the channel having a first voltage swing that is less than a threshold. The operations of 1015 may be performed according to the methods described with reference to FIGS. 3 through 6. In some examples, aspects of the operations of 1015 may be performed by a signal output component as described with reference to FIG. 7.

At 1020, the device may identify, after setting the voltage supply to the first voltage, that the channel is in a second mode in which the channel is unterminated. The operations of 1020 may be performed according to the methods described with reference to FIGS. 3 through 6. In some examples, aspects of the operations of 1020 may be performed by a mode identification component as described with reference to FIG. 7.

At 1025, the device may adjust, based on the channel being unterminated, the voltage supply for the driver to a second voltage that is lower than the first voltage. The operations of 1025 may be performed according to the methods described with reference to FIGS. 3 through 6. In some examples, aspects of the operations of 1025 may be performed by a voltage supply component as described with reference to FIG. 7.

At 1030, the device may output, by the driver while the channel is in the second mode and based on adjusting the voltage supply to the second voltage, signaling over the channel having a second voltage swing that is less than the threshold. The operations of 1030 may be performed according to the methods described with reference to FIGS. 3 through 6. In some examples, aspects of the operations of 1030 may be performed by a signal output component as described with reference to FIG. 7.

Figure 11:
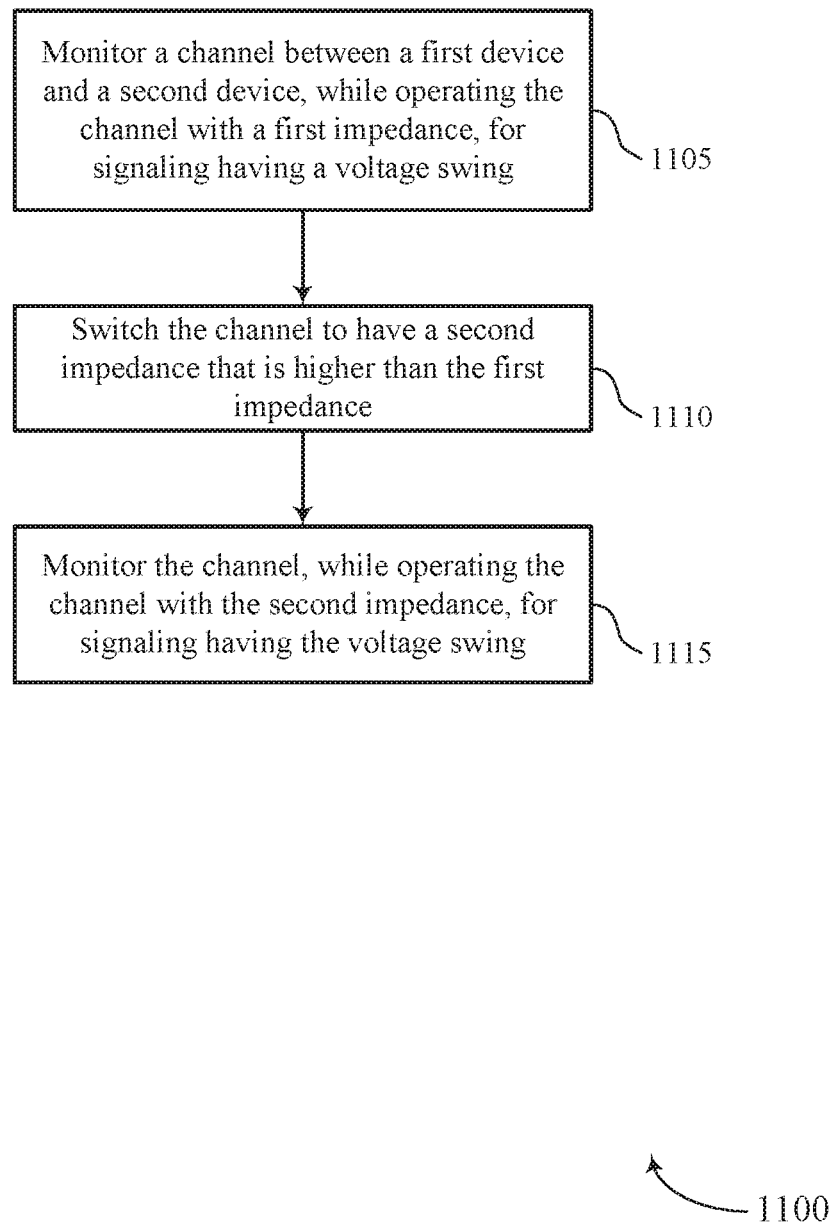

FIG. 11 shows a flowchart illustrating a method or methods 1100 that supports multi-voltage operation for driving a multi-mode channel in accordance with aspects of the present disclosure. The operations of method 1100 may be implemented by a device or its components as described herein. For example, the operations of method 1100 may be performed by device as described with reference to FIG. 8. In some examples, the device may execute a set of instructions to control the functional elements of the device to perform the described functions. Additionally or alternatively, the device may perform aspects of the described functions using special-purpose hardware.

At 1105, the device may monitor a channel between a first device (e.g., the device) and a second device, while operating the channel with a first impedance, for signaling having a voltage swing. The operations of 1105 may be performed according to the methods described with reference to FIGS. 3 through 6. In some examples, aspects of the operations of 1105 may be performed by a channel monitoring component as described with reference to FIG. 8.

At 1110, the device may switch the channel to have a second impedance that is higher than the first impedance. The operations of 1110 may be performed according to the methods described with reference to FIGS. 3 through 6. In some examples, aspects of the operations of 1110 may be performed by a channel switching component as described with reference to FIG. 8.

At 1115, the device may monitor the channel, while operating the channel with the second impedance, for signaling having the voltage swing (that is, for the same voltage swing as monitored for at 1105). The operations of 1115 may be performed according to the methods described with reference to FIGS. 3 through 6. In some examples, aspects of the operations of 1115 may be performed by a channel monitoring component as described with reference to FIG. 8.

In some examples, an apparatus as described herein may perform a method or methods, such as the method 1100. The apparatus may include features, means, or instructions (e.g., a non-transitory computer-readable medium storing instructions executable by a processor) for monitoring a channel between a first device (e.g., the apparatus) and a second device, while operating the channel with a first impedance, for signaling having a voltage swing, switching the channel to have a second impedance that is higher than the first impedance, and monitoring the channel, while operating the channel with the second impedance, for signaling having the voltage swing.

Some examples of the method 1100 and the apparatus described herein may further include operations, features, means, or instructions for monitoring the channel, while operating the channel with the first impedance, for signaling in accordance with a first order of modulation, and monitoring the channel, while operating the channel with the second impedance, for signaling in accordance with a second order of modulation that may be lower than the first order of modulation.

In some examples of the method 1100 and the apparatus described herein, signaling in accordance with the first order of modulation includes three or more voltage levels.

Some examples of the method 1100 and the apparatus described herein may further include operations, features, means, or instructions for transmitting, to the second device, an indication of the switching from the first impedance to the second impedance.

In some examples of the method 1100 and the apparatus described herein, the indication of the switching from the first impedance to the second impedance includes an indication of a decrease in a data rate over the channel.

In some examples of the method 1100 and the apparatus described herein, operating the channel with the first impedance may include operating the channel in a terminated mode, and operating the channel with the second impedance may include operating the channel in an unterminated mode.

In some examples of the method 1100 and the apparatus described herein, the second device may be a memory device, and the first device may be a host device coupled with the memory device.

It should be noted that the methods described above describe possible implementations, and that the operations and the steps may be rearranged or otherwise modified and that other implementations are possible. Furthermore, portions from two or more of the methods may be combined.

In some examples, an apparatus or device may perform aspects of the functions described herein. The device may include a driver couplable with a channel for communication with the device, a voltage supply coupled with the driver, and a controller coupled with the voltage supply. The controller may be configured to cause the device to identify that the channel is in a first (terminated) mode associated with a first data rate, set the voltage supply for the driver to a first voltage corresponding to the first (terminated) mode, identify, after setting the voltage supply to the first voltage, that the channel is in a second (unterminated) mode associated with a second data rate that is lower than the first data rate, and set the voltage supply for the driver to a second voltage corresponding to the second (unterminated mode), where the second voltage is based at least in part on a channel voltage associated with the terminated mode.

In some examples, the controller may be operable to cause the device to configure the driver to generate symbols that each represent more than one bit of information when the channel is in the terminated mode and to configure the driver to generate symbols that each represent one bit of information when the channel is in the unterminated mode.

In some examples, the device may further include an output pin coupled with the driver (via which the driver is couplable with the channel), wherein the output pin comprises a DQ pin or a C/A pin.

In some examples, the second voltage may be based at least in part on a ratio between an impedance of the channel for the terminated mode and an impedance of the driver.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the terms "substantially" and "approximately" mean that the modified characteristic (e.g., a verb or adjective modified by the term substantially or approximately) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-periods of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for accessing a memory device, comprising:
identifying that a channel between a first device and a second device is in a first mode in which the channel is terminated;
configuring a driver coupled with the channel to have a first impedance when the channel is terminated;
setting a voltage supply for the driver to a first voltage based at least in part on the channel being terminated;
identifying, after setting the voltage supply to the first voltage, that the channel is in a second mode in which the channel is unterminated;
configuring the driver to have a second impedance when the channel is unterminated, the second impedance higher than the first impedance; and adjusting, based at least in part on the channel being unterminated, the voltage supply for the driver to a second voltage that is lower than the first voltage.

2. The method of claim 1, further comprising:
outputting, by the driver while the channel is in the first mode, signaling over the channel having a first voltage swing that is less than a threshold; and
outputting, by the driver while the channel is in the second mode and based at least in part on adjusting the voltage supply to the second voltage, signaling over the channel having a second voltage swing that is less than the threshold.

3. The method of claim 1, further comprising:
outputting, by the driver while the channel is in the first mode, signaling for the first mode that has an upper bound, wherein:
adjusting the voltage supply for the driver to the second voltage comprises setting the voltage supply equal to the upper bound of the signaling for the first mode.

4. The method of claim 1, wherein the second voltage is half of the first voltage.

5. The method of claim 1, further comprising:
outputting, by the driver while the channel is in the first mode, signaling over the channel using a first modulation scheme; and
outputting, by the driver while the channel is in the second mode, signaling over the channel using a second modulation scheme.

6. The method of claim 5, wherein the first modulation scheme is of a higher order than the second modulation scheme.

7. The method of claim 6, wherein:
the first modulation scheme comprises a pulse amplitude modulation three (PAM3) or a pulse amplitude modulation four (PAM4) modulation scheme; and
the second modulation scheme comprises a pulse amplitude modulation two (PAM2) or a non-return to zero (NRZ) modulation scheme.

8. The method of claim 1, further comprising:
receiving, at the first device, an indication of a change from the channel being in the first mode to the channel being in the second mode, wherein identifying that the channel is in the second mode is based at least in part on receiving the indication.

9. The method of claim 8, wherein the indication of the change indicates a data rate associated with the second mode.

10. The method of claim 1, further comprising:
communicating over the channel using a first data rate when the channel is in the first mode; and
communicating over the channel using a second data rate that is lower than the first data rate when the channel is in the second mode.

11. The method of claim 1, wherein:
the first mode corresponds to a first impedance between the channel and a voltage reference;
the second mode corresponds to a second impedance between the channel and the voltage reference, the second impedance greater than the first impedance; and
the second voltage is based at least in part on the first impedance and an impedance of the driver.

12. The method of claim 11, wherein the voltage reference is at a voltage lower than the second voltage.

13. The method of claim 1, further comprising:
identifying that the channel is changing from the first mode to the second mode; and
refraining from outputting, by the driver, signaling over the channel for a duration of time based at least in part on the channel changing from the first mode to the second mode.

14. The method of claim 1, wherein the first device is a memory device and the second device is a host device coupled with the memory device.

15. A method for accessing a memory device, comprising:
monitoring a channel between a first device and a second device, while operating the channel with a first impedance, for signaling having a voltage swing;
switching the channel to have a second impedance that is higher than the first impedance; and
monitoring the channel, while operating the channel with the second impedance, for signaling having the voltage swing.

16. The method of claim 15, further comprising:
monitoring the channel, while operating the channel with the first impedance, for signaling in accordance with a first order of modulation; and
monitoring the channel, while operating the channel with the second impedance, for signaling in accordance with a second order of modulation that is lower than the first order of modulation.

17. The method of claim 16, wherein:
signaling in accordance with the first order of modulation includes three or more voltage levels.

18. The method of claim 15, further comprising:
transmitting, to the second device, an indication of the switching from the first impedance to the second impedance.

19. The method of claim 18, wherein the indication of the switching from the first impedance to the second impedance comprises an indication of a decrease in a data rate over the channel.

20. The method of claim 15, wherein:
operating the channel with the first impedance comprises operating the channel in a terminated mode; and
operating the channel with the second impedance comprises operating the channel in an unterminated mode.

21. A device, comprising:
a driver couplable with a channel for communication with the device;
a voltage supply coupled with the driver; and
a controller coupled with the voltage supply and configured to cause the device to:
identify that the channel is in a terminated mode associated with a first data rate;
configure the driver to have a first impedance when the channel is terminated;
set the voltage supply for the driver to a first voltage corresponding to the terminated mode;
identify, after setting the voltage supply to the first voltage, that the channel is in an unterminated mode associated with a second data rate that is lower than the first data rate;
configure the driver to have a second impedance when the channel is unterminated, the second impedance higher than the first impedance; and
set the voltage supply for the driver to a second voltage corresponding to the unterminated mode, the second voltage based at least in part on a channel voltage associated with the terminated mode.

22. The device of claim 21, wherein the controller is further configured to cause the device to:

configure the driver to generate symbols that each represent more than one bit of information when the channel is in the terminated mode; and configure the driver to generate symbols that each represent one bit of information when the channel is in the unterminated mode.

23. The device of claim 21, further comprising:

an output pin coupled with the driver, wherein the output pin comprises a data (DQ) pin or a command/address (C/A) pin.

24. The device of claim 21, wherein the second voltage is based at least in part on a ratio between an impedance of the channel for the terminated mode and an impedance of the driver.

* * * * *